United States Patent [19]
Donnelly et al.

[11] Patent Number: 6,125,157
[45] Date of Patent: Sep. 26, 2000

[54] DELAY-LOCKED LOOP CIRCUITRY FOR CLOCK DELAY ADJUSTMENT

[75] Inventors: Kevin S. Donnelly, San Francisco; Pak Shing Chau, San Jose; Mark A. Horowitz, Palo Alto; Thomas H. Lee, Cupertino; Mark G. Johnson, Los Altos; Benedict C. Lau, San Jose; Leung Yu, Santa Clara; Bruno W. Garlepp, Mountain View; Yiu-Fai Chan, Los Altos Hills; Jun Kim, Redwood City; Chanh Vi Tran, San Jose; Donald C. Stark, Palo Alto, all of Calif.

[73] Assignee: Rambus, Inc., Mountain View, Calif.

[21] Appl. No.: 08/795,657

[22] Filed: Feb. 6, 1997

[51] Int. Cl.⁷ ........................................... H04L 7/00
[52] U.S. Cl. ..................... 375/371; 375/358; 375/373; 327/141; 327/158
[58] Field of Search ...................... 327/141, 158, 327/156, 160, 175, 233, 244, 261, 276; 331/14, 17, 25, 117 FE; 375/371, 375, 376, 358, 373

[56] References Cited

U.S. PATENT DOCUMENTS

| | | | |
|---|---|---|---|
| 4,338,569 | 7/1982 | Petrich | 327/158 |
| 4,884,041 | 11/1989 | Walker | 331/57 |
| 5,180,994 | 1/1993 | Martin et al. | 331/38 |
| 5,399,995 | 3/1995 | Kardontchik et al. | 331/17 |
| 5,451,894 | 9/1995 | Guo | 327/241 |
| 5,485,490 | 1/1996 | Leung et al. | 375/371 |
| 5,513,327 | 4/1996 | Farmwald et al. | 395/309 |
| 5,532,633 | 7/1996 | Kawai | 327/174 |
| 5,534,805 | 7/1996 | Miyazaki et al. | 327/144 |
| 5,550,783 | 8/1996 | Stephens, Jr. et al. | 365/233 |
| 5,570,054 | 10/1996 | Takla | 327/292 |
| 5,614,885 | 3/1997 | Lee et al. | 327/158 |
| 5,712,883 | 1/1998 | Miller et al. | 375/371 |
| 5,712,884 | 1/1998 | Jeong | 375/371 |
| 5,764,092 | 6/1998 | Wada et al. | 327/271 |

OTHER PUBLICATIONS

"A 250–622 MHz Deskew and Jitter–Suppressed Clock Buffer Using Two–Loop Architecture", Satoru Tanoi et al., IEEE Journal of Solid–State Circuits, vol. 31, No. 4, Apr. 1996.

"A 2.5 V CMOS Delay–Locked Loop for an 18 Mbit, 500 Megabyte/s DRAM", Thomas H. Lee et al., IEEE Journal of Solid–State Circuit, vol. 29, No. 12, Dec. 1994.

*Primary Examiner*—Stephen Chin
*Assistant Examiner*—Chieh M. Fan
*Attorney, Agent, or Firm*—Pennie & Edmonds LLP

[57] ABSTRACT

Delay-locked loop circuitry for generating a predetermined phase relationship between a pair of clocks. A first delay-locked loop includes a set of delay-producing elements arranged in a chain, the chain receiving an input clock and generating, from each delay element, a set of phase vectors, each shifted a unit delay from the adjacent vector. The first delay-locked loop adjusts the unit delays in the delay chain using a delay adjustment signal so that the phase vectors span a predetermined phase shift of the input clock. A second delay-locked loop selects, from the first delay-locked loop, a pair of phase vectors which brackets the phase of an input clock. A phase interpolator receives the selected pair of vectors and generates an output clock and a delayed output clock, the amount of the delay being controlled by the delay adjustment signal of the first delay-locked loop circuitry. A phase detector compares the delayed output clock with the input clock and adjusts the phase interpolator, based on the phase comparison, so that the phase of the delayed output clock is in phase with the input clock. As a result, there is a predetermined phase relationship between the output clock and the input clock, the phase relationship being the amount of delay between the output clock and the delayed output clock. Different phase relationships between the input and output clock are possible depending on the number of unit delays used.

20 Claims, 19 Drawing Sheets

DELAY-LOCKED LOOP CIRCUITRY FOR CLOCK DELAY ADJUSTMENT

BACKGROUND OF THE INVENTION

The present invention relates to clock delay adjustment circuitry. In particular, the present invention relates to the generation of a set of phase vectors and the generation of output clocks that have precise phase relationships to an input clock.

Previous art includes the Rambus patent, U.S. Pat. No. 5,485,490, by Leung and Horowitz, which discloses two independent loops, the first of which creates a fixed number of phase vectors, the second of which creates an output clock that is in phase with the input clock. Also disclosed in this patent is the use of separate circuitry to create a leading phase clock to the output clock by selecting a pair of phase vectors and interpolating between them to produce an output that leads the output clock by the delay between phase vectors available from the first loop.

IEEE Journal of Solid-State Circuits, Vol. 29, No. 12, December 1994, Lee, et. al. ("Lee") discloses a pair of delay-locked loops (DLL) for transmitting and receiving data in DRAMs. IEEE Journal of Solid-State Circuits, Vol. 31, No. 4, April 1996, Tanoi et al. shows a two-loop architecture in which a frequency locked-loop (FLL) is designed to lock onto an external input frequency and to control the DLL for lock-in to the phase of the external input clock.

It is desirable to improve on the generation of a leading output clock to the in-phase output clock. There are several drawbacks to the invention disclosed in U.S. Pat. No. 5,485,490. Phase-locked loop circuitry employing a VCO and single order loop filter to create phase vectors is a second order system. This second order system has stability problems associated with its operation. Furthermore, the VCO phase lock loop accumulates phase error in response to sudden changes in phase on inputs to the loop, where the input includes not only the input clock but also the power supplies to the loop. This occurs because the loop changes the frequency of the VCO in response to a sudden phase change and this frequency shift is integrated to become phase error which persists for a time on the order of the reciprocal loop bandwidth (see Lee, above). This causes the loop to be noise sensitive when the noise is in the form of sudden phase shifts. Another drawback regarding the prior art patent is that the subloop used for generating the in-phase clock relies on the accuracy and similarity of a second phase interpolator (out-of-phase phase interpolator) to produce the leading clock. Any lack of matching between the out-of-phase phase interpolator and the in-phase phase interpolator will create a phase error in the desired phase relationship between the leading clock and the in-phase clock. Another drawback concerns the acquisition time of the VCO which can be quite long after restoration of a lost input clock, depending on how long the input clock has been absent.

SUMMARY OF THE INVENTION

The present invention provides delay-locked loop circuitry for generating a predetermined phase relationship between a pair of clocks. A first delay-locked loop (DLL) includes delay elements arranged in a chain, the chain receiving an input clock and generating, from the delay elements, a set of phase vectors, each shifted a unit delay from the adjacent vector. The first delay-locked loop adjusts the unit delays in the delay chain using a delay adjustment signal so that the phase vectors span a predetermined phase shift of the input clock.

In a preferred embodiment, a second DLL is used, although the second DLL could be used with another circuit which produces two different delayed clock signals. The second DLL selects, from the first DLL, a pair of phase vectors which brackets the phase of an input clock. A phase interpolator receives the selected pair of vectors and generates an output clock and a delayed output clock, the amount of the delay being controlled by the delay adjustment signal of the first delay-locked loop circuitry.

Preferably, a phase detector in the second DLL compares the delayed output clock with the input clock and adjusts the phase interpolator, based on the phase comparison, so that the phase of the delayed output clock is in phase with the input clock. The phase interpolator is preferably adjusted with a control circuit including a digital memory for storing a count corresponding to the delay adjustment, which can be maintained in the absence of the input clock signal.

Preferably, the first DLL includes a control circuit with a digital memory for providing the desired delay adjustment to the adjustable delay elements. A filter is used between the phase detector and the control circuit to reduce loop jitter.

The present invention is advantageously used for the transmit and receive clocks in a high-speed DRAM and a high-speed DRAM bus channel.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which:

FIG. 19A is the amplifier in which the duty cycle is corrected and FIG. 19B is the duty cycle error detecting circuit which applies a correction signal to the amplifier in FIG. 19A;

DESCRIPTION OF THE PREFERRED EMBODIMENT

Embodiments of the present invention provide a method and circuitry to generate a set of phase vectors in a way that is more immune to noise on loop inputs including the power supplies, leading to a more stable set of phase vectors. Also, an output clock that has a predetermined phase relationship with an input clock is provided. The effect of clock buffer delays between the input clock and output clock is minimized. The delay of an adjustable delay element is adjusted with a counter and a digital-to-analog converter, the count in the counter digitally representing the current delay adjustment of the delay-locked loop. The digital count is converted to a signal suitable for adjusting an adjustable delay element used in a delay-locked loop.

The current delay adjustment setting of the loop is digitally represented so that the setting may be stored while the loop is in a powered-down or low power state. There is quick re-acquisition of the locked state of a delay-locked loop after the delay-locked loop has been powered down.

Figure 1:
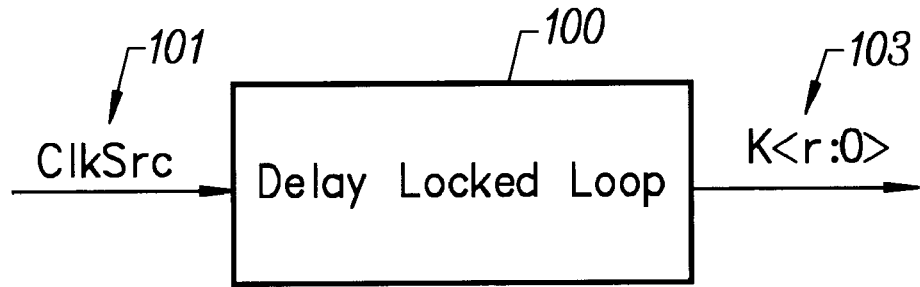
FIG. 1 shows a block diagram of a delay locked loop for generating phase vectors, K<r:0>.
Figure 12:
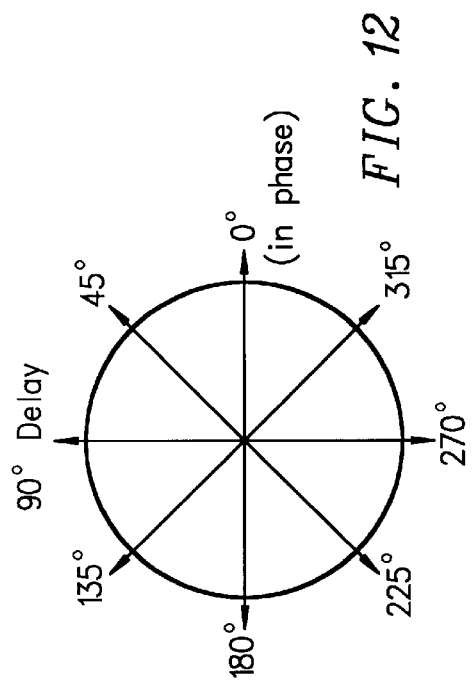
FIG. 12 shows a set of eight phase vectors each separated by a 45 degree interval and spanning 360 degrees shift of the 0 degree vector.
Figure 11:
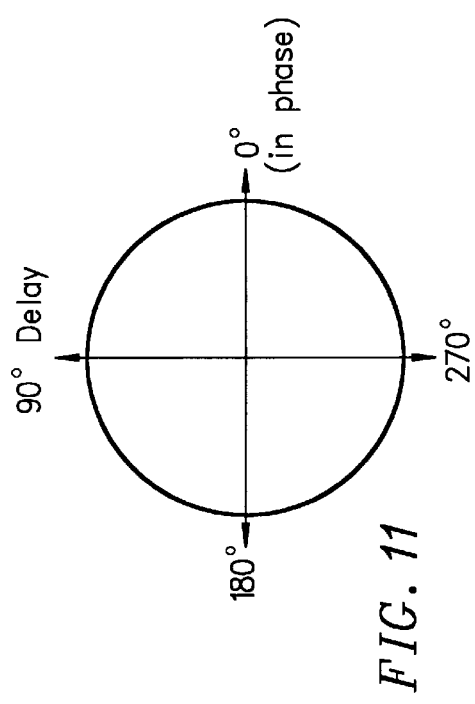
FIG. 11 shows a set of four phase vectors each separated by a 90 degree interval and spanning 360 degrees shift of the 0 degree vector.
Figure 13:
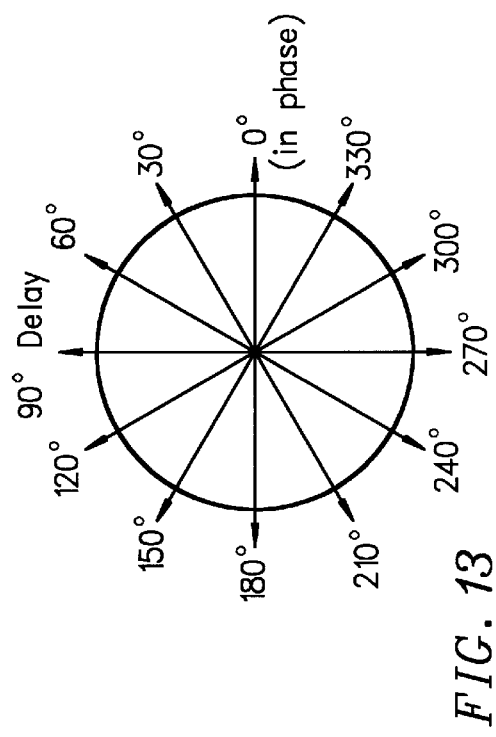
FIG. 13 shows a set of 12 phase vectors each separated by a 30 degree interval and spanning 360 degrees shift of the 0 degree vector.

In one embodiment of the present invention, a delay-locked loop (DLL) is employed for generating phase vectors. Referring to FIG. 1, the DLL 100 receives an external clock, ClkSrc 101, and generates phase vectors, K<r:0> 103. A convenient way to represent the set of phase vectors for a periodic signal is to draw the vectors in phase space as in FIG. 11. In this figure there are four vectors each spaced apart by 90 degrees and spanning a 360 degree phase shift of the 0 degree vector. Each vector in this figure represents a time delay of one-fourth of the cycle of the periodic signal. FIGS. 12 and 13 show alternate sets of phase vectors. FIG. 12 shows a set of vectors spaced at 45 degree intervals and spanning a 360 degree phase shift of the 0 degree vector. FIG. 13 shows a set of vectors spaced at 30 degree intervals and spanning a 360 degree phase shift of the 0 degree vector.

Figure 2:
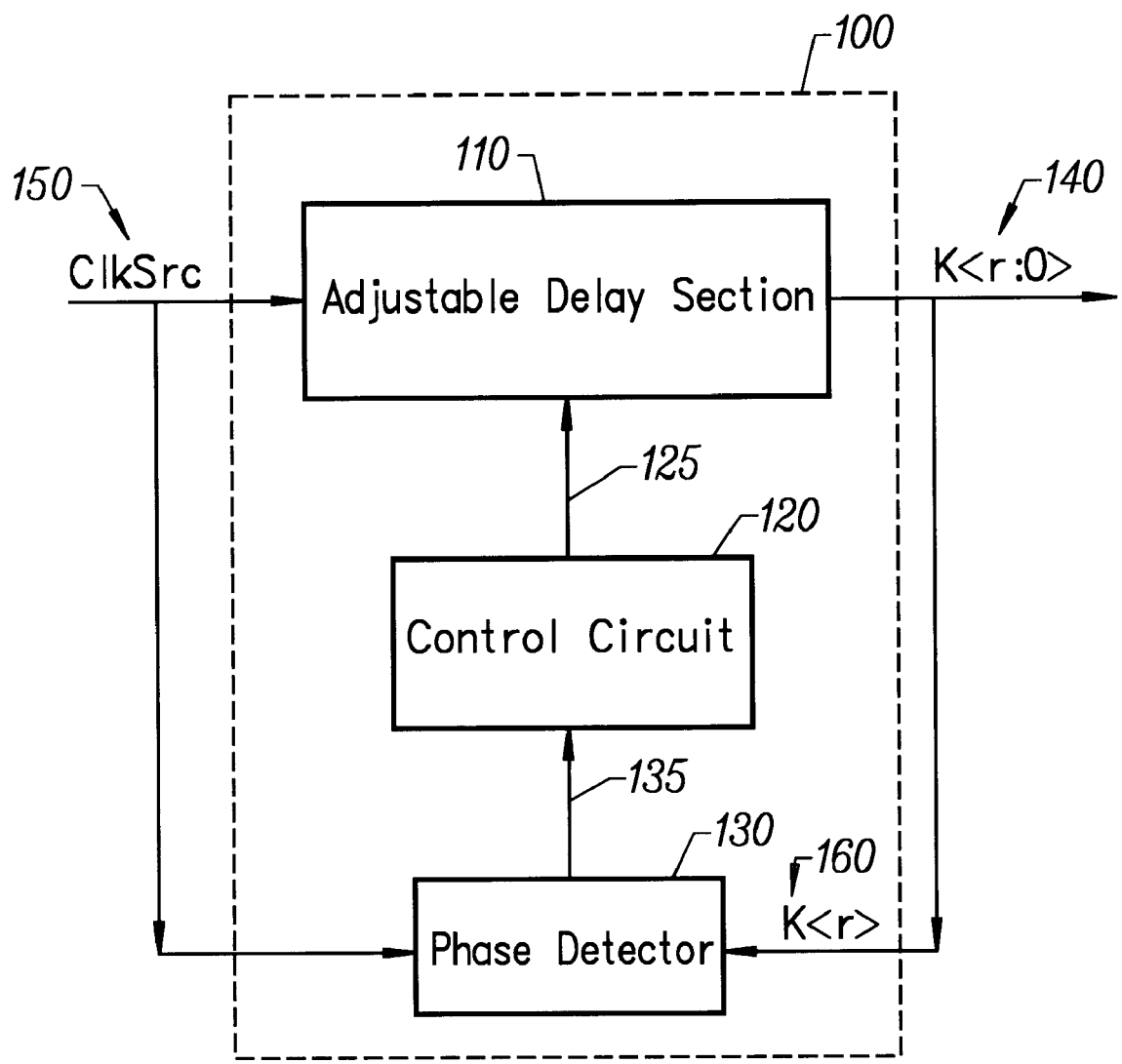
FIG. 2 shows a more detailed block diagram than FIG. 1 of a delayed locked loop for generating phase vectors, K<r:0>, according to one embodiment.

Referring to the embodiment shown in FIG. 2, the DLL 100 is a first order loop comprising at adjustable delay section 110, a control circuit 120 and a phase detector 130. The phase detector 130 receives the external clock, ClkSrc 150 from which it derives a clock input ClkIn (not shown), a set of phase vector lines 140 and the last phase vector K<r> on line 160. The output of phase detector 130 is coupled to the control circuit 120 which processes the output of the phase detector to generate a delay adjust signal 125 for adjusting the delay of the delay elements. The adjustable delay elements are adjusted so that the phase of K<r> is the same as the clock input, ClkIn.

Figure 3:
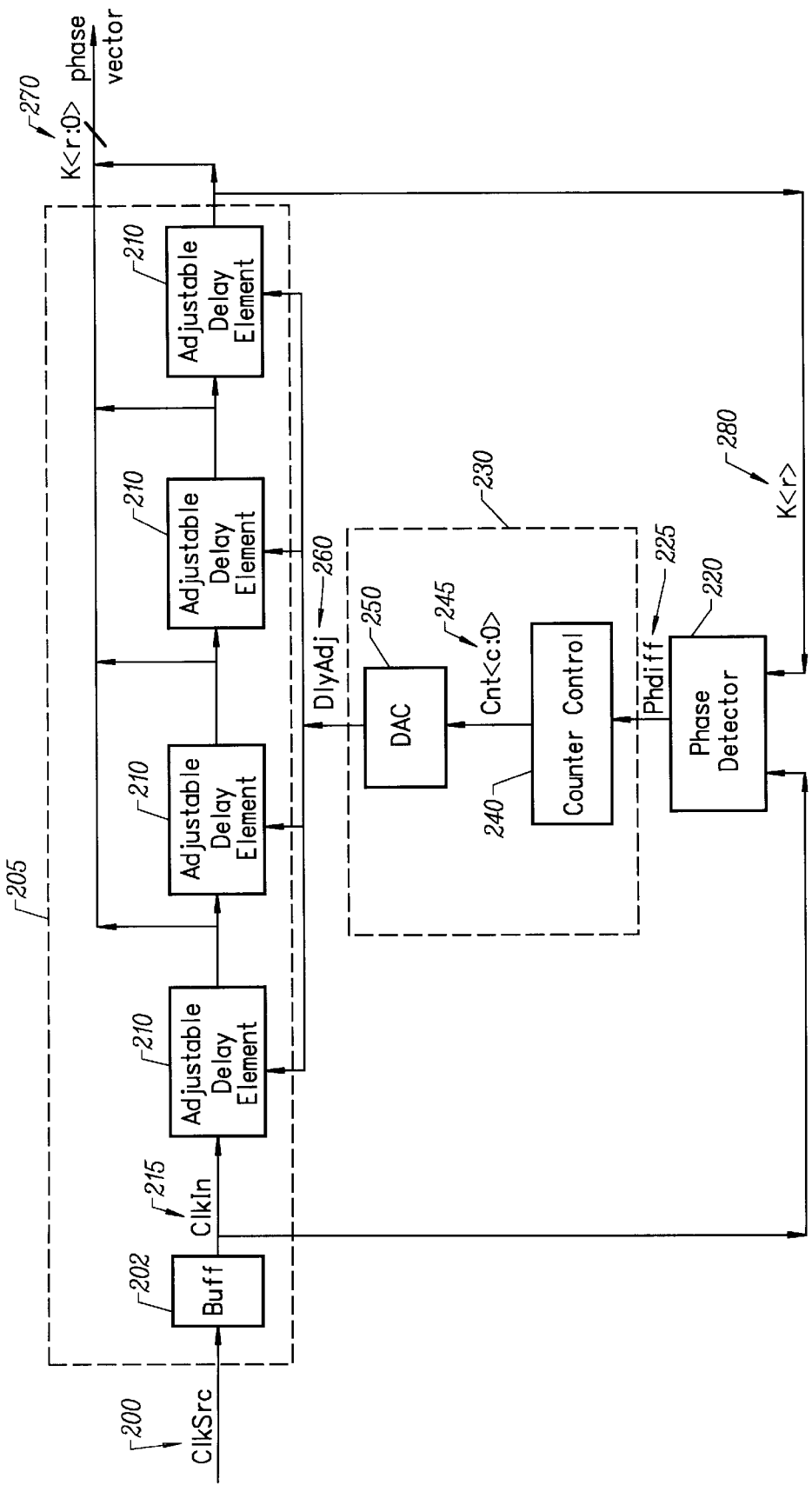
FIG. 3 shows a more detailed architecture than FIG. 2 of a delayed locked loop for generating phase vectors, K<r:0>, according to one embodiment.

FIG. 3 shows an embodiment of the DLL in more detail. In particular, adjustable delay section 205 comprises a set of four identical adjustable delay elements 210 connected in series with the output of each delay element 210 except the last element connected to the input of the next element 210. While four delay elements are shown in the particular embodiment, any number such as two, three, four, six, eight or twelve, can be used. This arrangement produces a set of clocks, called phase vectors K<r:0> 270, each shifted in time from the next by a delay, called a unit delay, generated by the adjustable delay section 205. Each adjustable delay element 210 receives the delay adjust signal DlyAdj 260 from control circuit 230, comprising counter control circuit 240 and digital-to-analog converter (DAC) 250. Counter control circuit 240 receives an input, PhDiff 225, from phase detector 220 and generates count Cnt<c:0> 245 for input to the DAC. In one embodiment, control circuit 230 is implemented with digital circuits to permit the storage of the current delay adjustment setting of the loop, held by Cnt<c:0>245, during times when the ClkSrc 200 is not present, perhaps during a period when the system is shut down to save power. The saved setting permits the loop to quickly re-acquire a locked condition when the ClkSrc is reactivated.

Continuing with FIG. 3, phase detector 220 receives as inputs ClkIn 215 derived from the ClkSrc 200 via buffer 202 and the last phase vector K<r> 280. In another embodiment, buffer 202 performs duty cycle correction as well as amplification to assure that ClkIn 215 has a 50% duty cycle. Duty cycle correction is discussed in greater detail below.

Figure 16A:
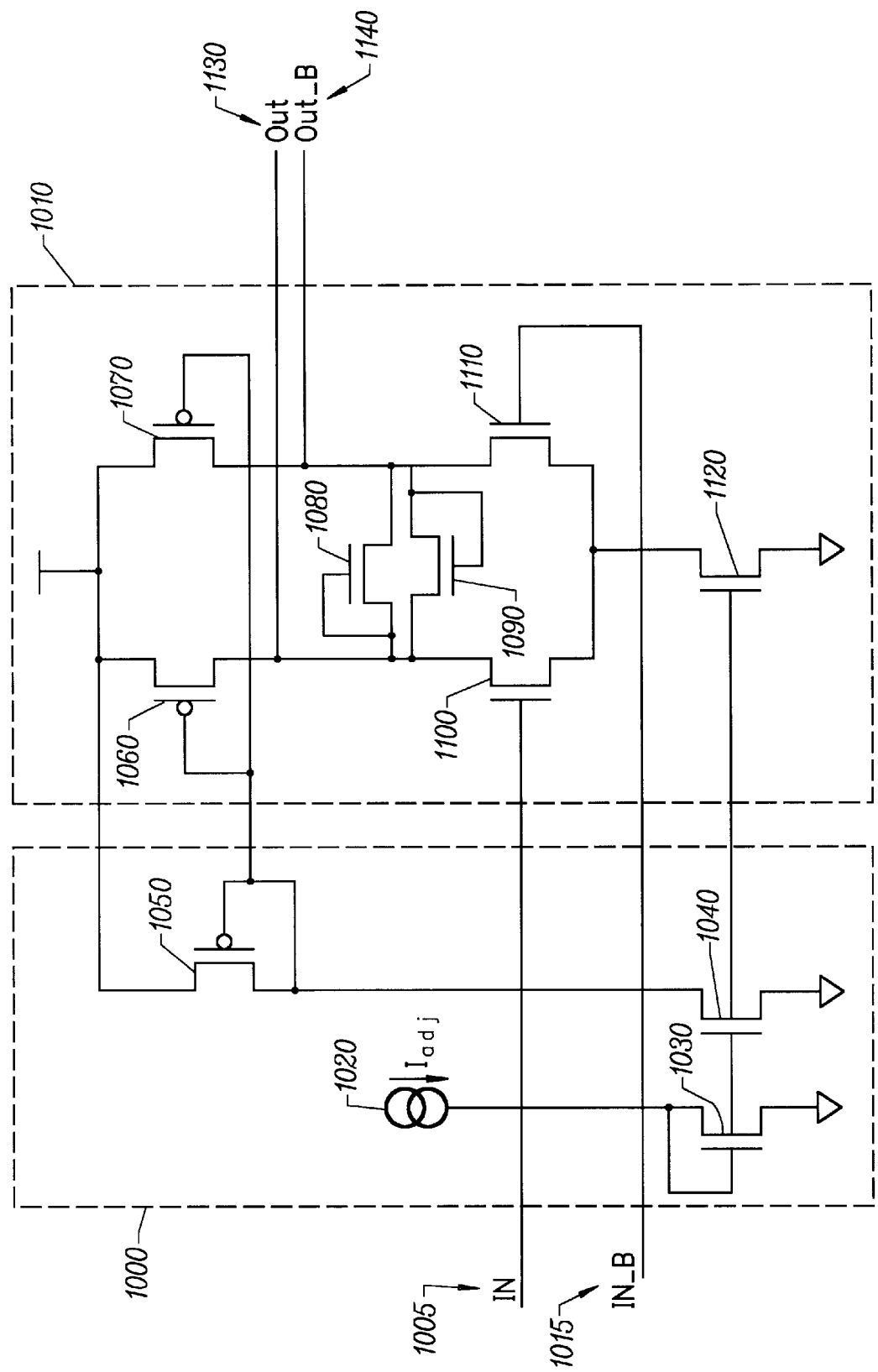
FIG. 16A shows an embodiment of a delay element for use in a delay-locked loop.

In FIG. 3, adjustable delay element 210 may be implemented according to the embodiment shown in FIG. 16A, which shows a delay element 1010 and a bias circuit 1000. In FIG. 16A the delay element is a differential delay element, having both true and complementary inputs and outputs. The circuit operates to delay the differential inputs IN 1005 and IN_B 1015 to produce delayed outputs Out 1130 and Out_B 1140. The amount of delay is adjusted by adjustable current source 1020, which controls the amount of current switched by differential pair 1100 and 1110. The greater the amount of current switched the smaller delay produced by the differential pair. Transistors 1080 and 1090 act as clamps to limit the swing of the differential pair allowing small delays to be realized by the circuit.

Figure 16B:
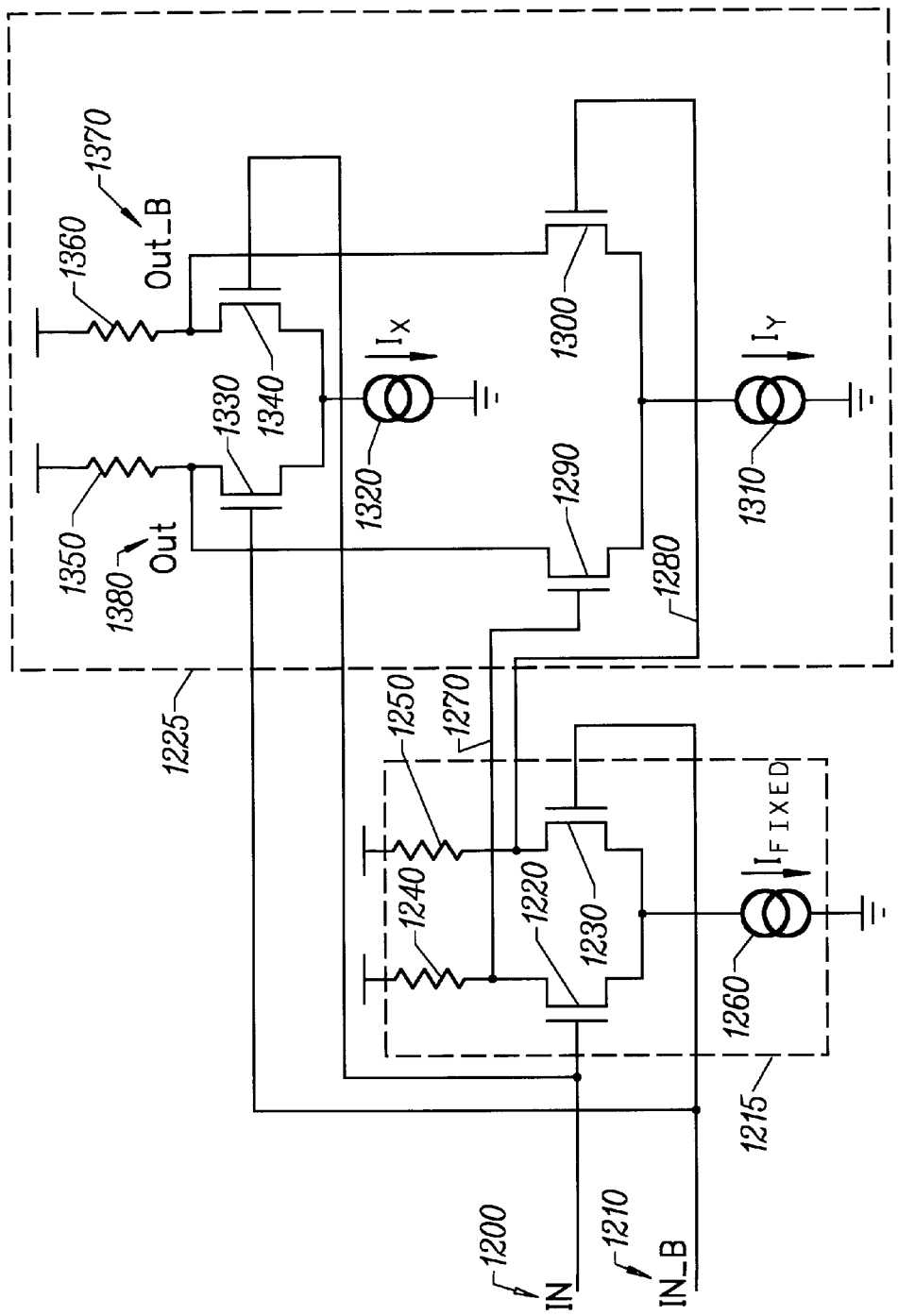
FIG. 16B shows another embodiment of a delay element for use in a delay-locked loop.

The adjustable delay element may also be implemented according to the embodiment shown in FIG. 16B. In this figure section 1215 functions as a fixed delay comprising a current source 1260 and a differential pair 1220 and 1230, and section 1225 operates as a phase interpolator comprising differential pair 1330 and 1340 with current source 1320 and differential pair 1290 and 1300 with current source 1310 to produce a delay that is adjustable between a stage delay to a fixed delay plus the stage delay. The stage delay represents the fixed delay time through the interpolator stage 1225. The phase interpolator delay stage 1225 is adjusted by varying the current sources Ix 1320 and Iy 1310. If Ix is at maximum and Iy is turned off the output signals Out 1380 and Out_B 1370 are produced by transistors 1330 and 1340 in phase with the input signals but delayed by the stage delay. If Iy 1310 is maximum and Ix 1320 is off then the output signals Out 1380 and Out_B 1370 are produced by transistors 1290 and 1300 and are delayed by amount of the fixed delay provided by the 1215 section plus the stage delay. Therefore, the phase interpolator delay stage 1225 is adjustable through a range of delay equal to the fixed delay of the 1215 section.

Figure 17:
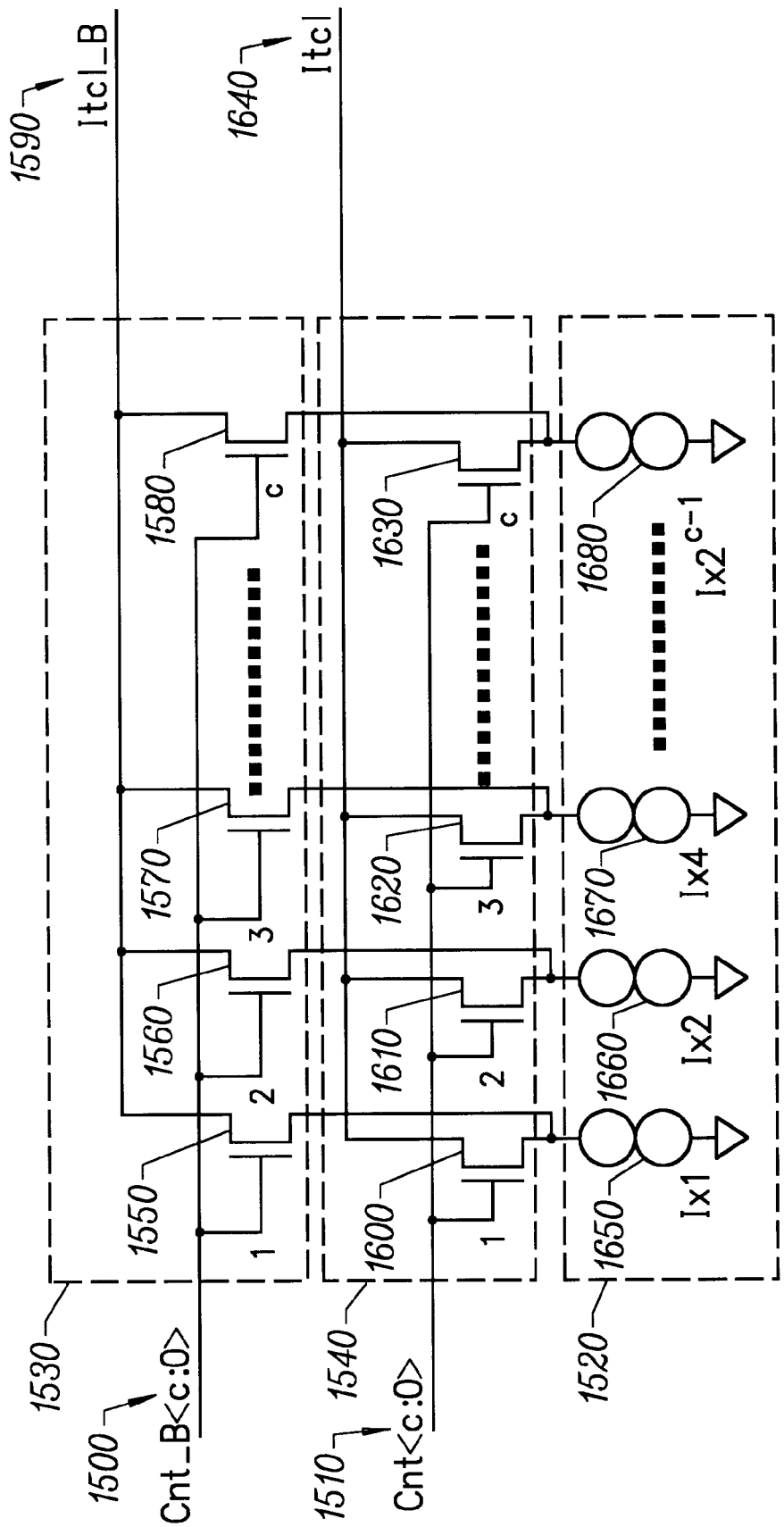
FIG. 17 shows an embodiment of a digital to analog converter for use in a delay-locked loop.

FIG. 3 depicts a DAC which may be implemented according to the DAC shown in FIG. 17, which depicts a circuit for converting a digital count Cnt<c:0> 1510 and its complement Cnt_B<c:o> 1500 to a differential current pair, Ictl 1640 and Ictl_B 1590 proportional to the count. FIG. 17 shows three sections of circuitry, a set of binary weighted current sources 1520, a set of switches 1540 for producing the true current output Ictl 1640 and a set of switches 1530 for producing the complement output Ictl_B 1590. If the count input Cnt<c:0> 1510 is all ones then Ictl 1640 has a maximum current, Max_I, which is the sum of all of the current sources 1650, 1660, 1670 through 1680 and the complementary current Ictl_B is zero. If the count input Cnt<c:0> 1510 is all zeros then Ictl_B 1590 has the maximum current, Max I, and Ictl is zero. Intermediate counts produce intermediate amounts of current, Im, and (Max_ I–Im) on Ictl and Ictl_B respectively. This DAC is suitable for controlling the differential input delay adjust signals of the adjustable delay element 210 shown in FIG. 16B for the delay-locked loop shown in FIG. 3.

The system shown in FIG. 3 operates as follows. Phase detector 220 compares the ClkIn signal, with the last phase vector K<r> 280 to determine the phase difference from a predetermined phase relationship between the two clocks. In one embodiment the predetermined phase difference could be zero degrees. In another embodiment the predetermined phase difference could be 180 degrees. The phase difference is represented by signal PhDiff 225. Counter control block then converts the PhDiff signal into a digital count, Cnt<c:0> 245, and DAC 250 converts the count value into an analog quantity, DlyAdj 260, for adjusting the adjustable delay elements. In some embodiments the Cnt<c:0> signal and the DlyAdj signal may be differential signals. The delay adjustment operates to change the delay of the adjustable delay elements so that the phase difference from the predetermined phase relationship between clock input, ClkIn and K<r> is made close to zero. When this condition occurs the DLL is locked, and each adjustable delay element has substantially the same delay. Thus each phase vector is displaced in time from the adjacent vector by an amount equal to the setting of the adjustable delay element. This time displacement is termed a unit delay. The result is that the phase vectors span a 360 degree phase shift of the ClkIn signal 215. These phase vectors can now be used in another DLL to lock the phase of an output clock in precise phase relationship to the arbitrary phase of an input clock.

For FIG. 3, an alternate embodiment could use fewer delay elements to produce phase vectors that span the 360 degree phase shift of the ClkIn if each delay element, such as the ones depicted in FIGS. 16A and 16B, can produce both true and complementary outputs. For example, instead of using four delay elements each separated by 90 degrees, two delay elements separated by 90 degrees could be used if the delay element had true outputs yielding delays of 90 and 180 degrees and complementary outputs yielding 270 and 360 degrees, respectively. Alternatively, fewer delay elements could be used if the phase detector were designed to detect phase differences from a predetermined phase relationship of 180 degrees. Using such a phase detector would only require that two delay elements be used spanning a 180 degree phase shift of the ClkIn signal. The outputs of the delay elements could be inverted in a separate circuit which receives the phase vectors, so that a set of phase vectors spanning 360 degrees is obtained. For embodiments in which the phase shift of the ClkIn signal spans only 180 degrees buffer 202 may perform a duty cycle correction function to assure that the ClkIn signal 215 has a 50% duty cycle. This is especially important when the remaining span of 180 degrees is derived through inversion of the phase vectors spanning the first 180 degrees, because inversion will not generate the proper phase shift if the duty cycle is not substantially close to 50%.

Figure 4:
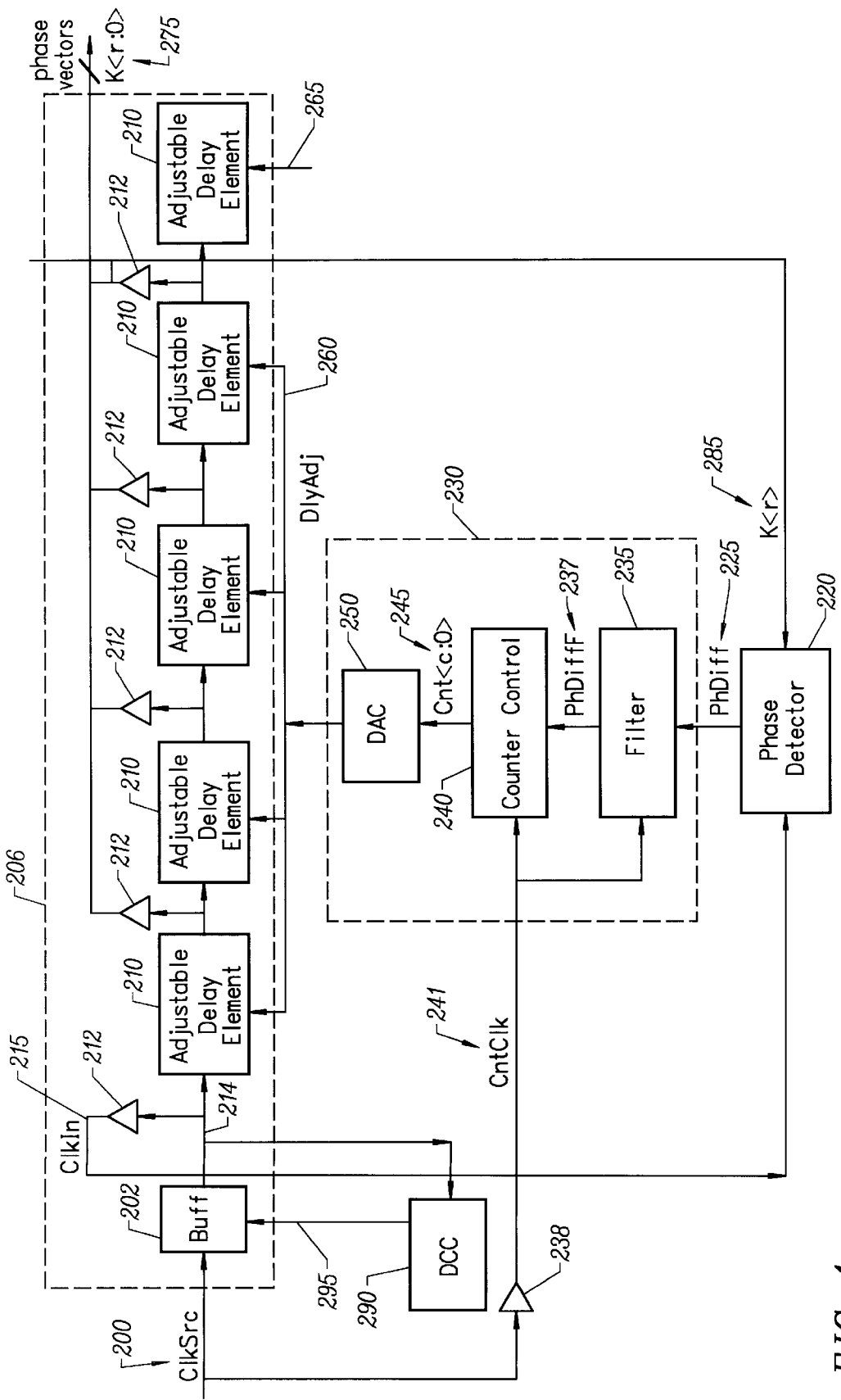
FIG. 4 shows another embodiment of a delay-locked loop for generating phase vectors using buffered delay elements and a buffer clock source.

Referring the embodiment in FIG. 4, an additional adjustable delay element has been placed in the circuit to receive the last phase vector. This additional delay has the effect of insuring that each phase vector has the identical loading as the other phase vectors, so that phase errors caused by loading differences are substantially eliminated. Rather than connecting the delay adjust signal 265 to the DlyAdj signal 260, signal 265 may be connected to a convenient voltage, because the output of the additional delay is not used. This eliminates some of the loading on the DlyAdj signal 260.

Continuing with the embodiment of FIG. 4, phase vectors 275 are buffered by buffers 212 in order to further control the loading on the vectors by isolating the loading of the phase vectors from other circuits which may receive the vectors. A buffered version of ClkIn 215 and a buffered version of the last phase vector K<r> 285 are sent to the phase detector. This guarantees that buffered version of the phase vectors K<r:0> 275 are separated in phase by a unit delay and that the set of buffered phase vectors span a 360 degree or 180 degree shift of the buffered ClkIn signal depending upon the embodiment chosen.

Also shown in FIG. 4 is a version of buffer 202 which has a duty cycle correcting circuit 290 attached. The duty cycle correcting circuit 290 senses signal 214 for a deviation from a 50% duty cycle. It then feeds a correction signal to buffer 202 to correct signal 214. In some embodiments signal 214 is a differential signal and the error signal 295 is a differential signal.

Figure 19A:
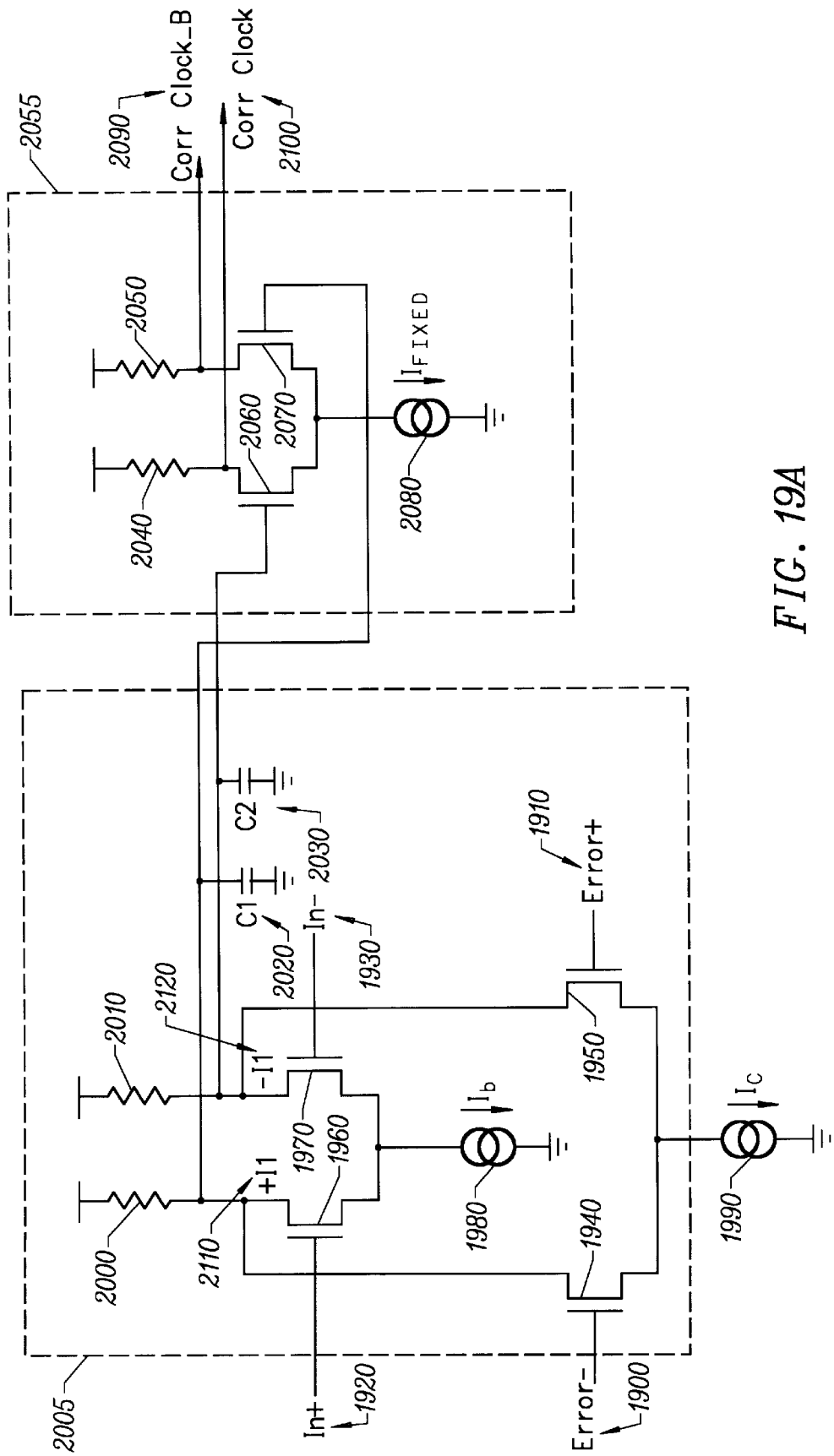
FIGS. 19A and 19B show an embodiment of a duty cycle correcting amplifier for use in a delay-locked loop.
Figure 19B:
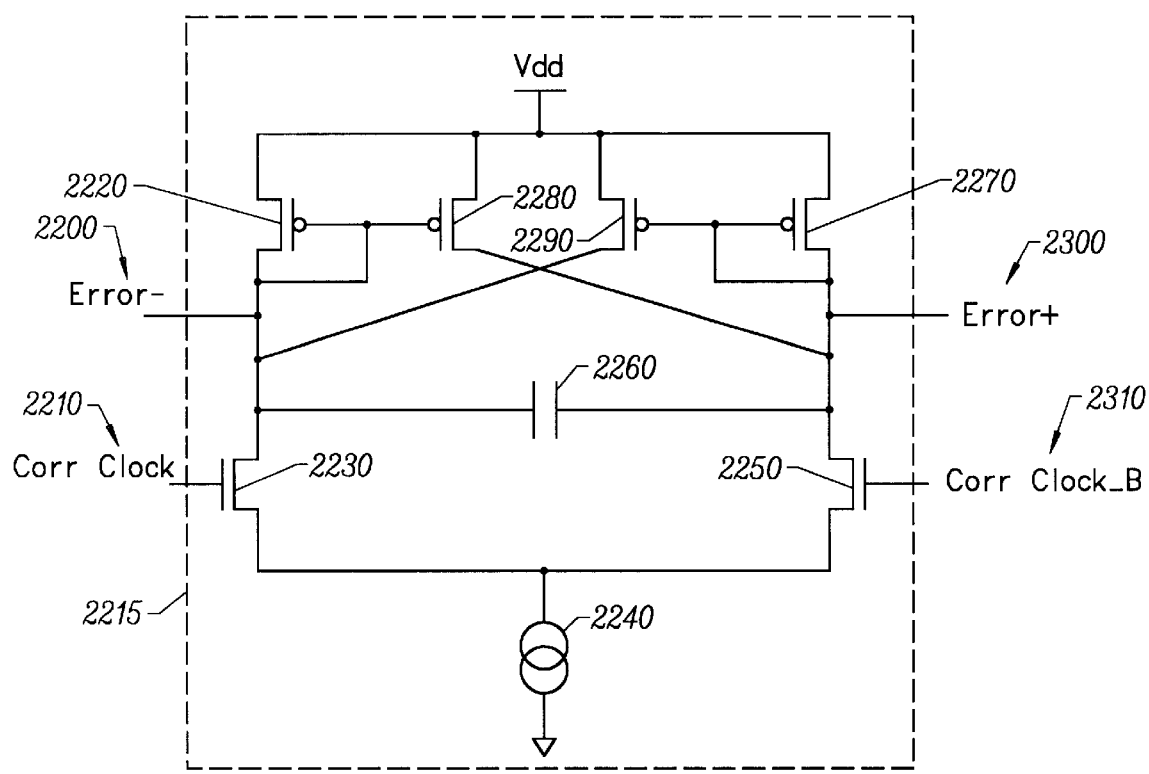

An embodiment of a duty cycle correcting amplifier is shown in FIGS. 19A and 19B. FIG. 19A shows the correcting stage 2005 and the buffering stage 2055 and FIG. 19B shows the duty cycle error detecting stage 2215. In FIG. 19A differential pair 1960 and 1970 receive the input clock differential on In+ 1920 and In− 1930 and produce a differential output clock on Corr Clock_B 2090 and Corr Clock 2100. If the duty cycle deviates from 50% then the circuit shown in FIG. 19B will produce a differential error voltage signal pair Error+ 2300 and Error− 2200 from the differential pair 2230 and 2250 and capacitor 2260 acting as an integrator. Transistors 2220, 2280, 2290 and 2270 function as a load element especially suited for controlling the charge leakage across integrating capacitor 2260. The differential error voltage signal pair is fed back to the correcting stage 2005 such that the duty cycle error in the Corr Clock and Corr Clock_B signals is reduced by altering currents 2110 and 2120 depending on the polarity of the error. Thus, the output of the buffering stage 2055 is a clock having a duty cycle substantially close to 50%.

In FIG. 4, as in FIG. 3, Phase detector 220 compares the ClkIn signal, with the last phase vector K<r> 280 to determine the phase difference from a predetermined phase relationship between the two clocks, and signal PhDiff 225 represents that difference. In FIG. 3, PhDiff signal 225 contains random variations due to the instantaneous phase error which, when used directly by Counter Control 240, causes an amount of overall loop jitter, thus affecting the stability of the phase vectors. In FIG. 4, the amount of jitter is reduced by filtering the PhDiff signal before converting it to DlyAdj signal 260. Shown in FIG. 4 is an embodiment in which control circuit 230 includes filter 235 in addition to counter control 240 and digital to analog converter (DAC) 250. Filter circuit 235 receives an input, PhDiff 225, from phase detector 220 and CntClk 241 from buffer 238 and generates output PhDiffF 237 for input to the Counter Control 240, which receives CntClk 241 and generates count Cnt<c:0> 245 for input to DAC 250. In an embodiment in which the PhDiff signal is a digital signal, a digital filter is used, but either analog or digital filtering may be employed. CntClk 241 operates the circuitry in both Filter 235 and Counter Control 240. Buffer 238 is employed when ClkSrc is a small swing signal but Counter Control 240 and Filter 235 require a full swing signal.

Types of digital filters that can be employed to reduce loop jitter include a majority-detector filter or an unanimity-detector filter. In either filter type, CntClk 241 operates circuitry which samples and stores the state, either true or false, of PhDiff 225. A majority-detector filter saves the last N samples, where N is an odd number, of PhDiff signal 225 and determines whether a majority of the last N cycles, say 3 out of 5 (N), are the same. If so, then the majority-detector filter activates PhDiffF 237 to alter the count in counter control 240. This type of filter alters the count in counter control 240 on every sample because there is always a majority of true or false samples. An unanimity-detector filter also records the last N samples, where N can be even or odd, of the PhDiff signal but instead determines whether all N cycles are the same. If all samples are the same, the unanimity-detector filter activates the PhDiffF signal 237 to alter the count and at times during which not all the samples are the same, the PhDiffF signal will not be activated to alter the count. Both types of filters have the effect of reducing loop jitter, and either type may be used.

Figure 5:
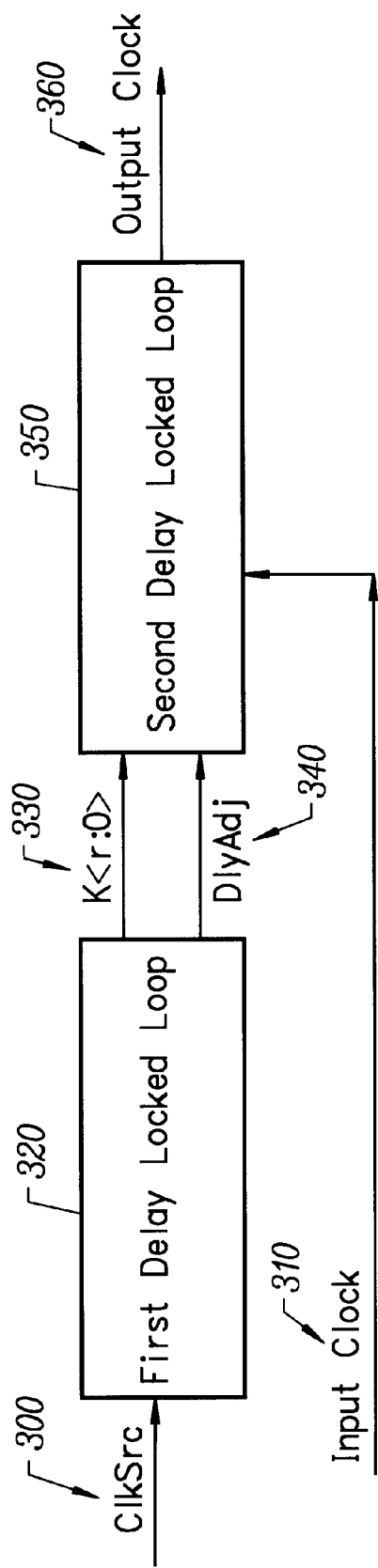
FIG. 5 shows a block diagram of the architecture of a DLL for generating an Output Clock in precise phase relationship with an Input Clock according to one embodiment.

Turning now to FIG. 5, a pair of delay-locked loops is depicted for generating an output clock having a predetermined phase relationship to an input clock. The first delay-locked loop 320 is one which generates phase vectors K<r:0> 330 from a clock source ClkSrc 300 as described above. The phase vectors and the DlyAdj signal 340 are then used by a second delay-locked loop 350 to create a precise phase relationship between Input Clock 310 and Output Clock 360.

Figure 6:
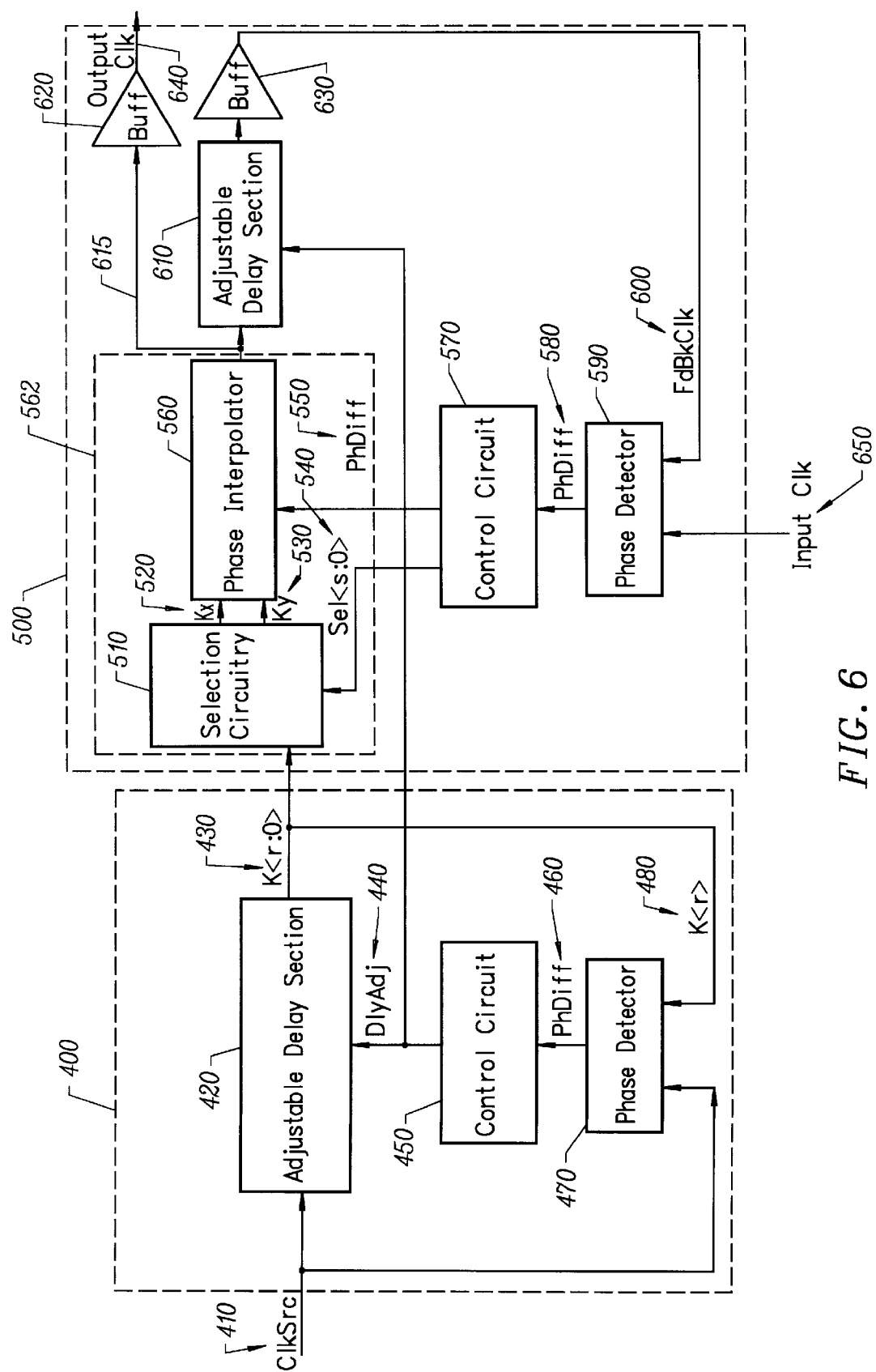
FIG. 6 shows a more detailed architecture than FIG. 5 of a DLL for generating an Output Clock in precise phase relationship with an Input Clock according to one embodiment.

FIG. 6 shows an embodiment of the loop of FIG. 5 in more detail. First loop 400 is the phase vector loop which receives ClkSrc 410 and generates phase vectors K<r:0> 430 and DlyAdj signal 440. The second loop 500 is the loop for creating the phase relationship between the Input Clk 650 and Output Clk 640. Loop 500 comprises a selection circuitry 510, phase interpolator 560, adjustable delay section 610 which represents an integer multiple of adjustable delay elements, clock buffers 620 and 630, control circuit 570 and phase detector 590.

In FIG. 6, selection circuitry 510 receives the phase vectors 430 and passes along a selected pair of vectors Kx 520 and Ky 530, which are received by phase interpolator 560. The phase interpolator generates an interpolated output clock 615 which is buffered by clock buffer 620 to become the Output Clk 640.

Adjustable delay section 610 also receives output clock 615 and feeds the delayed clock to clock buffer 630 to generate FdBkClk 600. Control circuit generates PhAdj signal 550 for controlling the interpolator 560. Control circuit 570 receives phase difference information, PhDiff 580, from phase detector 590, which detects the difference in phase between the Input Clk 650 and FdBkClk 600. As described previously, control circuit 570 may comprise counter control 240 and DAC 250 such as in FIG. 3, to enable the saving of the setting of the current phase adjustment of the loop or Filter 235, Counter Control 240 and DAC 250 as in FIG. 4 to additionally reduce loop jitter.

Figure 18:
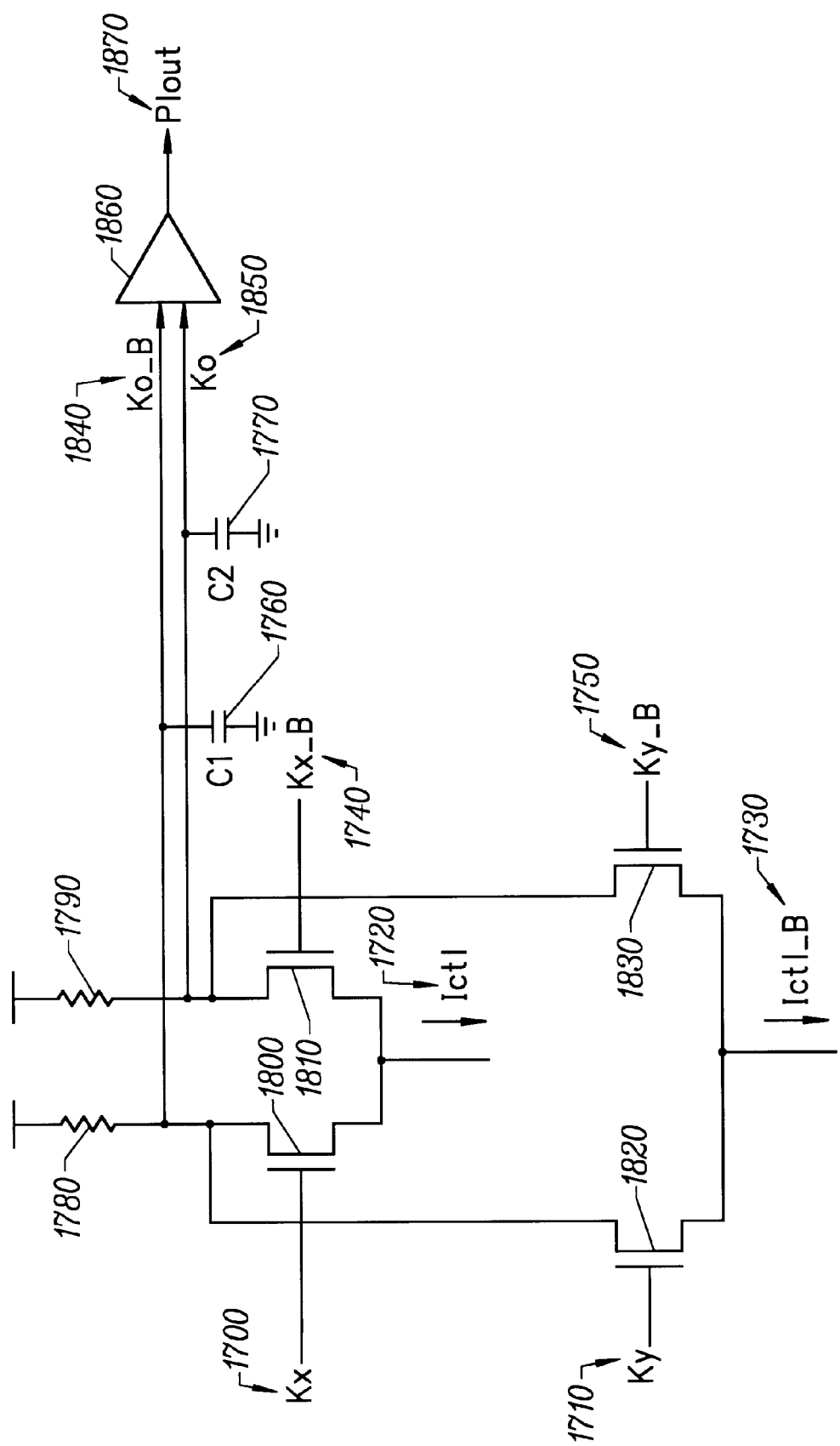
FIG. 18 shows an embodiment of a phase interpolator for use in a delay-locked loop.

Selection circuitry 510 may be implemented as an analog or digital set of switches comprising a multiplexer, depending upon whether the phase vectors are low swing or full swing signals. Phase interpolator 560 may be implemented as shown in FIG. 18. Alternately, selection circuitry 510 may be merged or combined with interpolator 560, shown in FIG. 6 as block 562. In some embodiments when selection circuitry is combined with the phase interpolator, the circuit shown in FIG. 18 is duplicated several times, each duplicate connected to a different set of switches for applying a particular phase vector to the interpolator.

The operation of the circuit of FIG. 18 is substantially similar to the circuit shown in FIG. 16B. Differential pair 1800 and 1810 receive one of the selected phase vectors Kx 1700 and Kx_B 1740 which is the complement of the Kx signal. Kx and Kx_B may be generated from a delay element having differential outputs as shown in FIG. 16A or 16B. Differential pair 1820 and 1830 receive the Ky 1710 phase vector and the Ky_B 1750 complementary phase vector. The phase interpolator functions as a weighted integrator using capacitors C1 1760 and C2 1770 and coincidence detector 1860. If Ictl 1720 is set at a maximum value and Ictl_B 1730 is zero then the output signal PIout 1870 is in phase with the Kx clock but delayed by a stage delay through the interpolator. If Ictl_B 1730 is set a maximum value and Ictl 1720 is zero then the output signal is in phase with the Ky clock but delayed by a stage delay. By adjusting the values of adjustable currents 1720 and 1730 any delay between Kx and Ky may be achieved.

Figure 14:
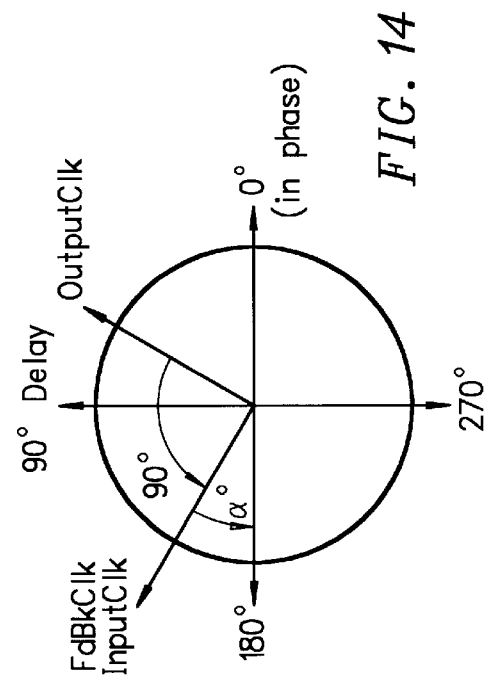
FIG. 14 shows a set of four phase vectors each separated by a 90 degree interval and spanning 360 degrees shift of the 0 degree vector, with the Input Clock and feedback clock between the 90 and 180 degree phase vectors and the Output Clock between the 0 and 90 degree vectors and 90 degrees earlier in time than the Input Clock.
Figure 15:
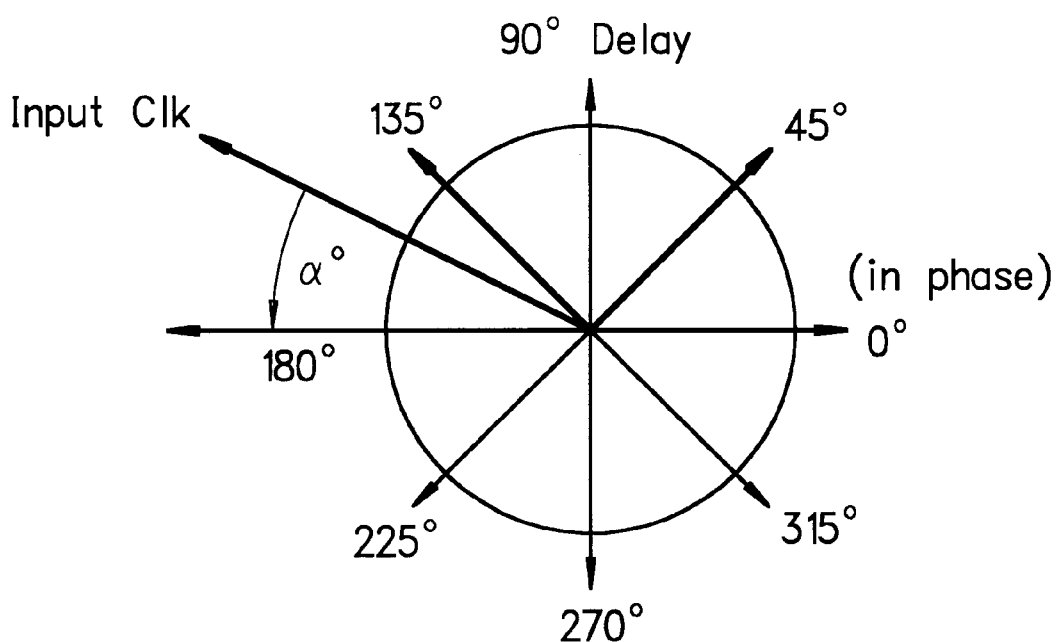
FIG. 15 depicts a case in which the Input Clock is between the 135 and 180 degree phase vectors, with the initially selected phase vectors being the 0 and 45 degree vectors.

The operation of loop 500 in FIG. 6 is as follows. Phase detector 590 determines what the difference in phase, if any, is between the Input Clk 650 and FdBkClk 600. This difference is then processed by control circuit 570 to select a pair of phase vectors via selection circuitry 510. The chosen pair of vectors is that pair between which the phase of Input Clk 650 lies, after accounting for fixed delays inherent in circuits in the path of the FdBkClk signal such as the phase selector, phase interpolator, adjustable delay section and clock buffer. An example of a pair of vectors meeting this requirement is shown in FIG. 14, in which the Input Clk is shown between the 90 degree and 180 degree vectors and at a delay of alpha degrees from the 180 degree vector. If the starting pair of vectors is not the correct pair then the control circuit steps through the pairs of vectors one step at a time until the correct pair is discovered. FIG. 15 depicts a circumstance in which the stepping of several phase vectors must occur if loop 500 starts in the 0 degree state before the correct pair is discovered. When the first pair of vectors, 0 and 45 degrees, is selected, the phase interpolator 560 is adjusted so that the phase interpolator output 615 is in phase with the 45 degree vector. While in this condition the 0 degree vector is replaced with the 90 degree vector by the control circuit and selection circuitry. Next, the phase interpolator is adjusted to produce an output in phase with the 90 degree vector and the 45 degree vector is replaced with the 135 degree vector. The phase interpolator is then adjusted to produce an output in phase with the 135 degree vector. Finally, the control circuit replaces the 90 degree vector with the 180 degree vector. Thus, while this stepping occurs the phase interpolator generates an output clock 615 which is in phase with one of the selected vectors, in particular, the one that will not be switched in selecting a new pair of vectors. The constraint that the interpolator generate the output clock in phase with the non-switched vector prevents the output clock from glitching during the stepping process. When the correct pair of vectors is determined by the loop then the phase interpolator is allowed to be adjusted by PhAdj signal 550 to precisely align the delayed output FdBkClk 600 to the phase of the Input Clk 650, which is at some phase, alpha degrees, (FIG. 14) from one of the selected phase vectors. When this occurs the loop is locked. FdBkClk 600 is delayed by at least one unit delay from adjustable delay section 610, the unit delay being precisely a delay between any two adjacent phase vectors 430 from the first loop because it is adjusted by the same DlyAdj 440 signal of the first loop. Thus, if the phase vectors from the first loop differ from each other by 90 degrees, then the unit delay is 90 degrees and the FdBkClk is delayed 90 degrees from the output of the phase interpolator 615, assuming one delay element in block 610. FIG. 14 shows this condition.

It will be noted that not only is a unit delay included in the feedback path of the second loop but so are the clock buffer and other fixed delays inherent in the phase selector and phase interpolator. Clock buffers 620 and 630 are matched buffers having the same physical construction. FdBkClk is thus delayed by an amount equal to a unit delay and a clock buffer delay plus the other fixed delays from the phase selector and phase interpolator. However, because the Output Clk 640 is delayed by the same amount of fixed delays, the clock buffer delays and fixed delays cancel and the difference between the Output Clk 640 and the Input Clock 650 is only the unit delay.

It should be noted that adjustable delay section 610 could comprise an integer multiple of unit delays, in which case the delay between the Input Clk 650 and Output Clk 640 would then be the integer multiple of unit delays. For example, if the multiple of the unit delay is 3 and the value of the unit delay 10 degrees then the Output Clk would lead the Input Clk by 30 degrees. If the multiple of the unit delay is zero, then the Input Clk and Output Clk would be in phase.

Figure 7:
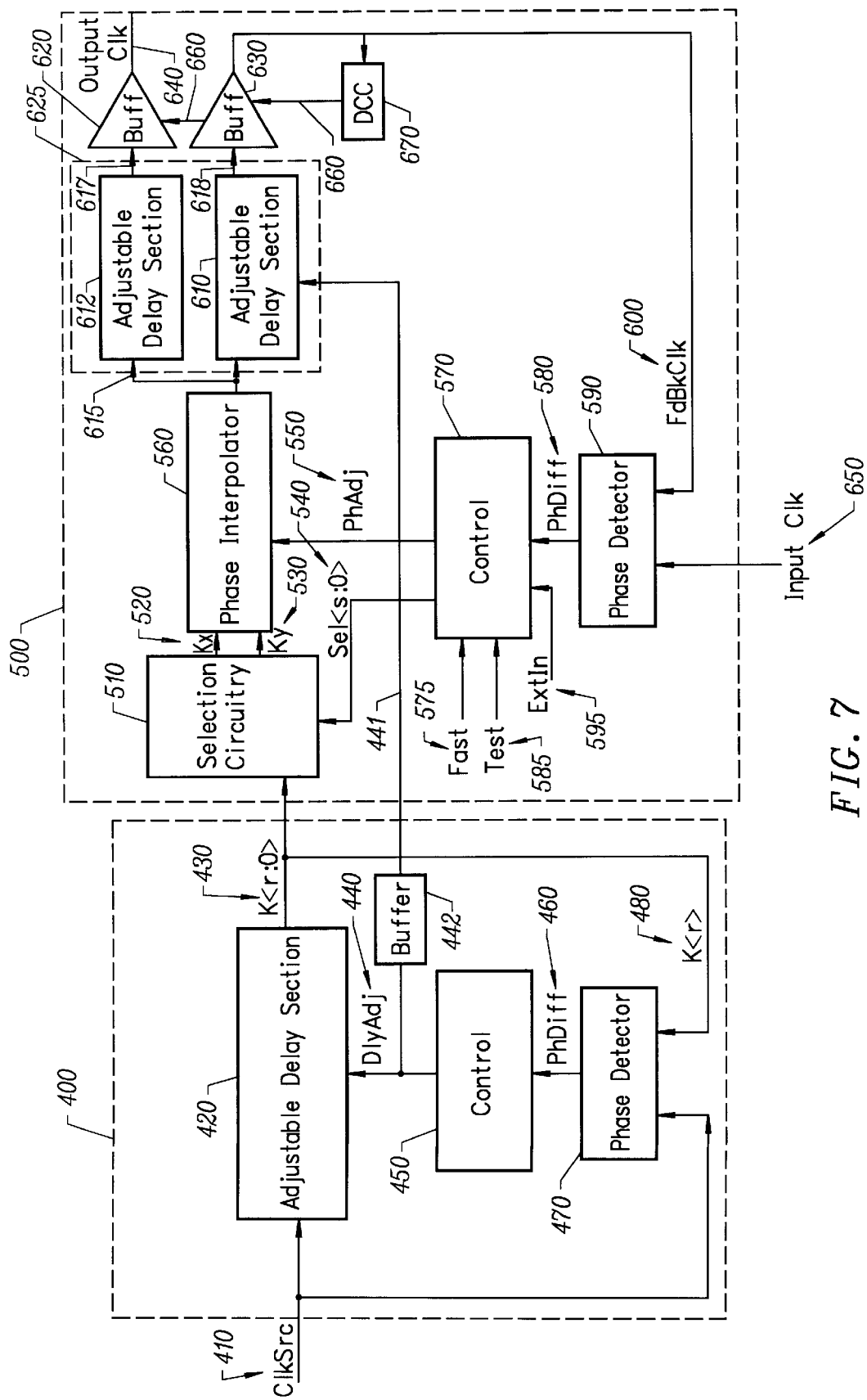
FIG. 7 shows another embodiment of a DLL for generating an Output Clock in precise phase relationship with an Input Clock using an adjustable delay section in the path of both the Output Clock and the feedback clock.

FIG. 7 is an alternate embodiment showing adjustable delay section 612 in the path of the Output Clk 640. This section has the same implementation as the section in the path of the FdBkClk 600 and provides a way for the Output Clk 640 to not only lead the Input Clk in phase but to lag it in phase. This latter condition occurs when the adjustable delay section 612 comprises a larger multiple of unit delays than adjustable delay section 610. Adjustable delay sections 612 and 610 may be implemented in a fashion similar to section 206 in FIG. 4 in order to insure that phase errors due to loading differences are minimized. The delay circuits shown in FIGS. 16A and 16B are suitable for implementing an adjustable delay element employed in the adjustable delay section 610 or 612. FIG. 7 also shows that buffers 620 and 630 may be implemented as duty cycle correcting amplifiers with the aid of duty cycle correction circuit 670. Buffers 620 and 630 may be implemented according to the circuitry shown in FIG. 19A and duty cycle correction circuit 670 may be implemented as shown in FIG. 19B. Finally, FIG. 7 shows three more inputs, Fast 575,Test 585 and ExtIn 595, to the control circuit 570. In one embodiment Fast signal 575 is used to alter the control circuit so that the loop can lock more quickly by taking larger phase adjustments toward the lock condition. In an embodiment in which the control circuit 570 is implemented as a counter, the Fast signal 575 can cause the counter to count by a multiple of the smallest step between counts. The Test signal 585 is used to allow the control circuit to be under the control of external signal ExtIn 595 rather than PhDiff 580 derived from the loop. This allows loop properties to be tested more easily.

Figure 8:
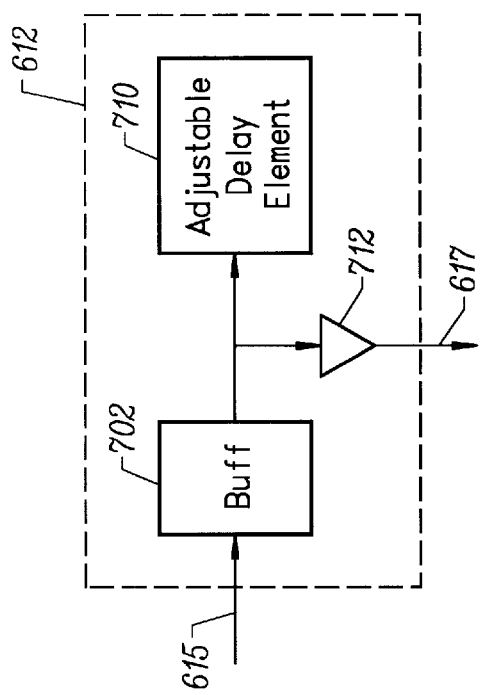
FIG. 8 shows another embodiment of an adjustable delay section having one adjustable delay for use in FIG. 7.
Figure 9:
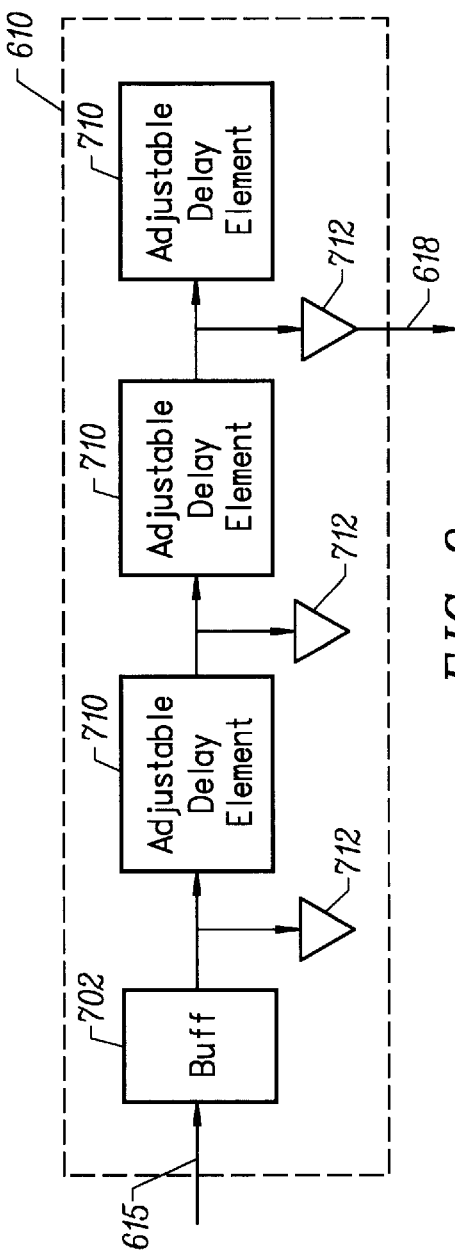
FIG. 9 shows another embodiment of an adjustable delay section having at least two adjustable delays for use in FIG. 7.
Figure 10:
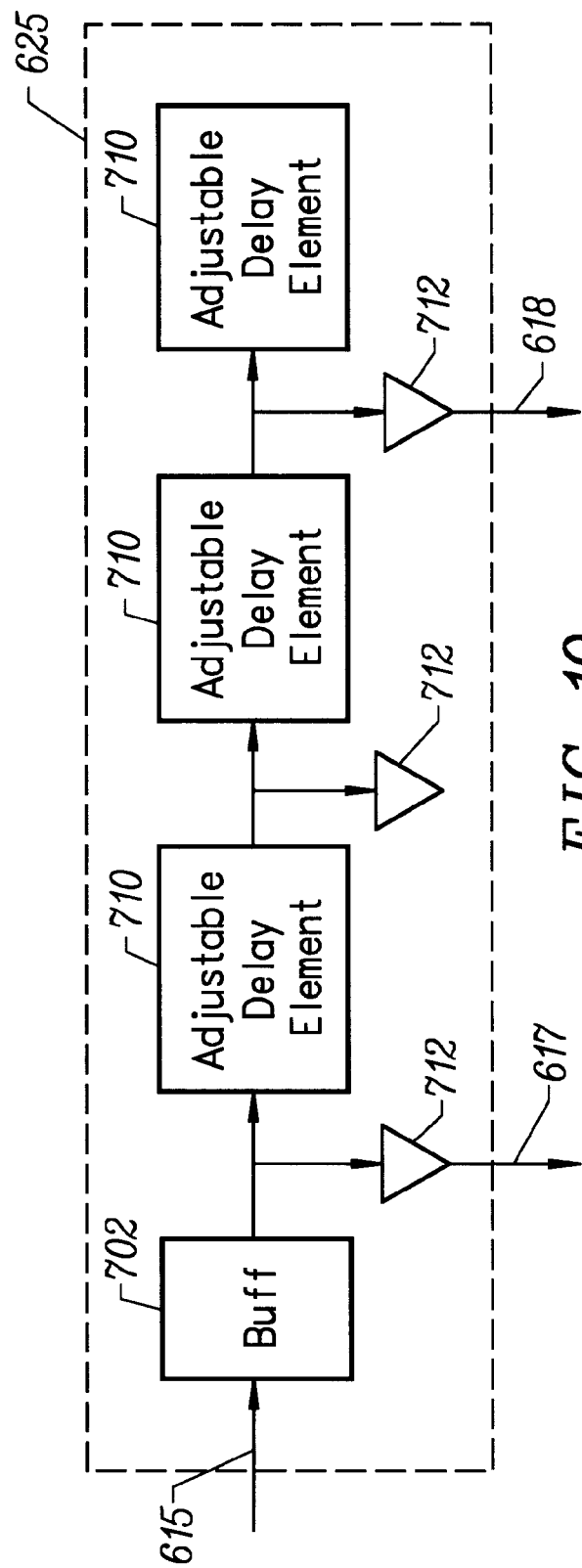
FIG. 10 shows an embodiment for producing a pair of delays from the same chain for use in FIG. 7.

FIG. 8 shows one embodiment of adjustable delay section 612. Block 612 comprises a buffer 702, similar to 202 in FIG. 4, an adjustable delay element 710 similar to adjustable delay element 210 in FIG. 4, and an output buffer 712 similar to the 212 buffer in FIG. 4. FIG. 9 shows an embodiment of adjustable delay section 610. This figure is similar to FIG. 8 but has more adjustable delay elements, but is still buffered at the front of the chain and has an additional delay element at the end of the chain. The adjustable delay sections in both FIG. 8 and FIG. 9 are controlled from an external delay adjust signal such as 441 as shown in FIG. 7, such that the setting produces a delay equal to the delay between phase vectors. If the adjustable delay sections are implemented in this fashion, loading differences are kept to a minimum and only the desired phase difference between signal 617 and 618 is generated. As may be easily seen it is not necessary that adjustable delay sections 610 and 612 be implemented as two separate and distinct sections. It is convenient in some embodiments to derive 617 and 618 from the same section 625 as shown in FIG. 7 and 10. The delay adjust signal 441 in FIG. 7 is buffered by buffer 442, in some embodiments, to isolate the loading effects of sections 610 and 612 from section 420.

Figure 20:
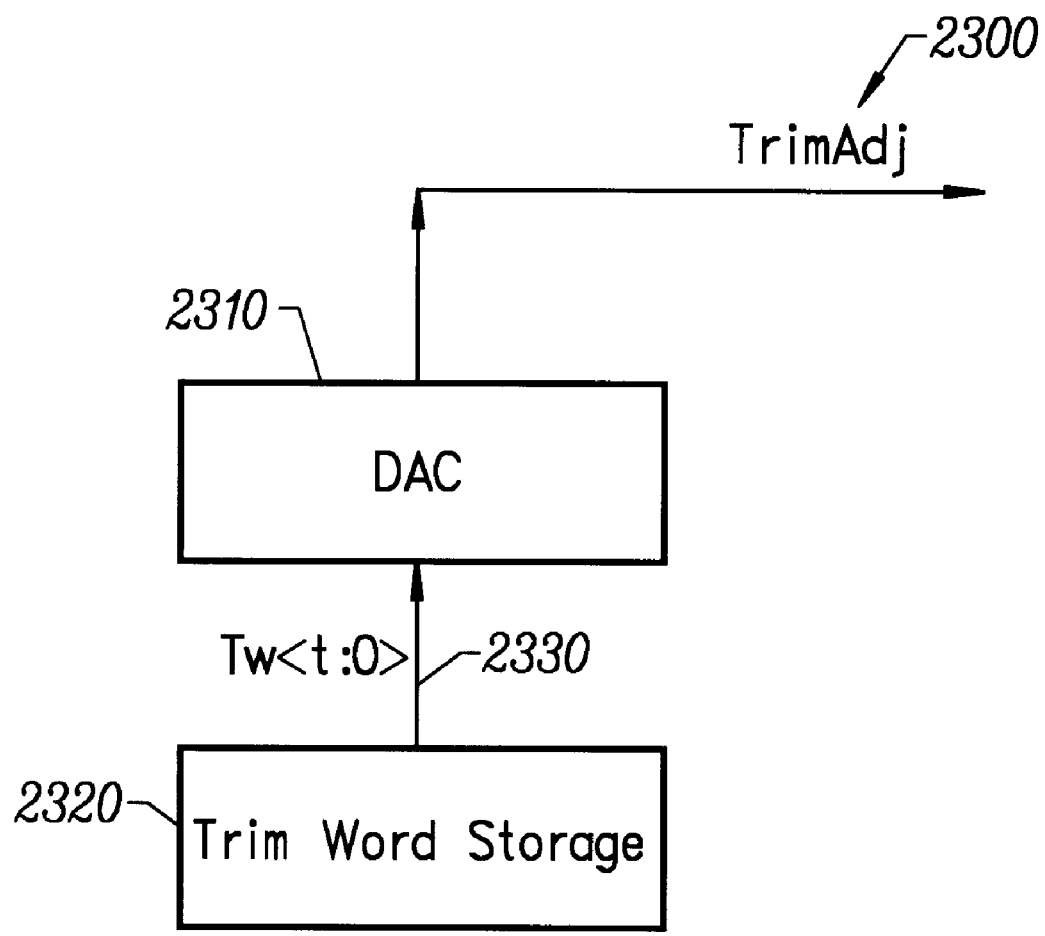
FIG. 20 is a block diagram of a TrimAdj circuit for use in one variation of the embodiment of FIG. 7.

FIG. 20 discloses circuitry for biasing the predetermined phase relationship between the input clock and the output clock with a fixed offset. The fixed offset is necessary when system requirements dictate that the predetermined phase relationship be altered by an amount that is smaller than is available from a unit a delay, for example a one degree phase shift. This fine tuning or trimming is accomplished by the TrimAdj signal 2300 which is combined with the DlyAdj signal 441 in FIG. 7. The TrimAdj signal 2300 adds a small amount of adjustment current to the adjustable delay sections 610 and 612. This causes the delay elements in those sections to have a delay that is slightly smaller or larger than the unit delay provided by the delay adjustment signal from the loop which generates the phase vectors. For example, if the delay elements in 610 and 612 are increased by one degree and the unit delay is 90 degrees than each delay element has a delay of 91 degrees. Because the delay between the input clock and the output clock is the difference in delay between the path of the output clock and the path of the feedback clock, the output clock is now 91 degrees ahead of the input clock. In FIG. 20, the TrimAdj signal 2300 is derived from DAC 2310 and trim word storage 2320. Trim word storage in some embodiments is a set of fuses or other permanent storage for holding a digital code TW<t:0> 2330 for setting the trim delay. DAC 2310 converts the trim word 2330 to an analog signal such as a current for controlling the delay elements in sections 610 and 612.

Figure 21:
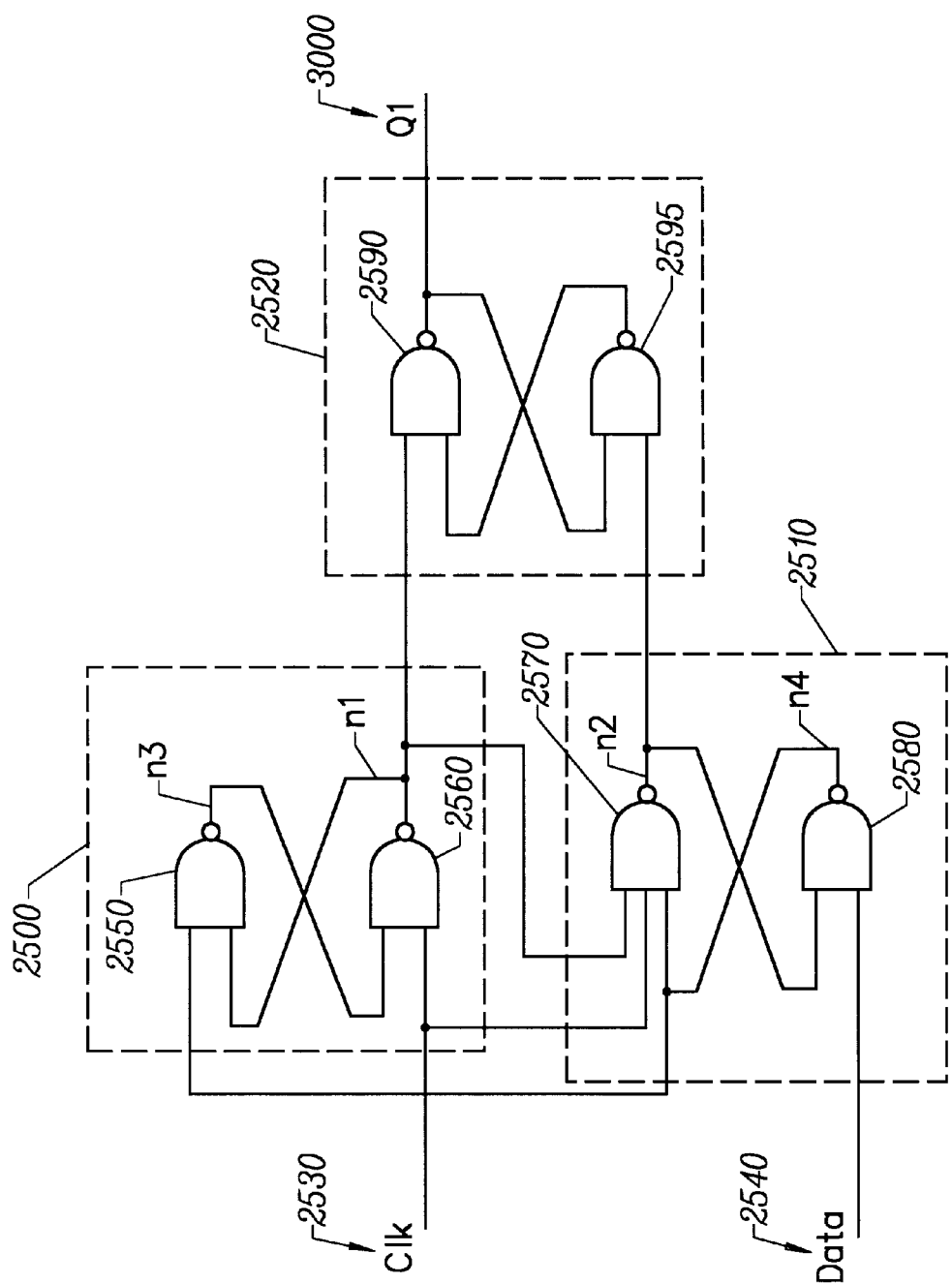
FIG. 21 is a circuit diagram of one embodiment of a phase detector as set forth in FIG. 6.

FIG. 21 is a circuit diagram of a phase detector circuit which could be used for the phase detector of FIGS. 2, 3, 4, 6 and 7. A clock input 2530 is shown, and data input 2540 would correspond to the feedback clock or phase vector. Output 3000 is the phase difference signal provided to the control circuit. The phase detector is implemented as three blocks 2500, 2510, and 2520 connected in flip-flop fashion using NAND gates 2550, 2560, 2570, 2580, 2590, and 2595.

Figure 22:
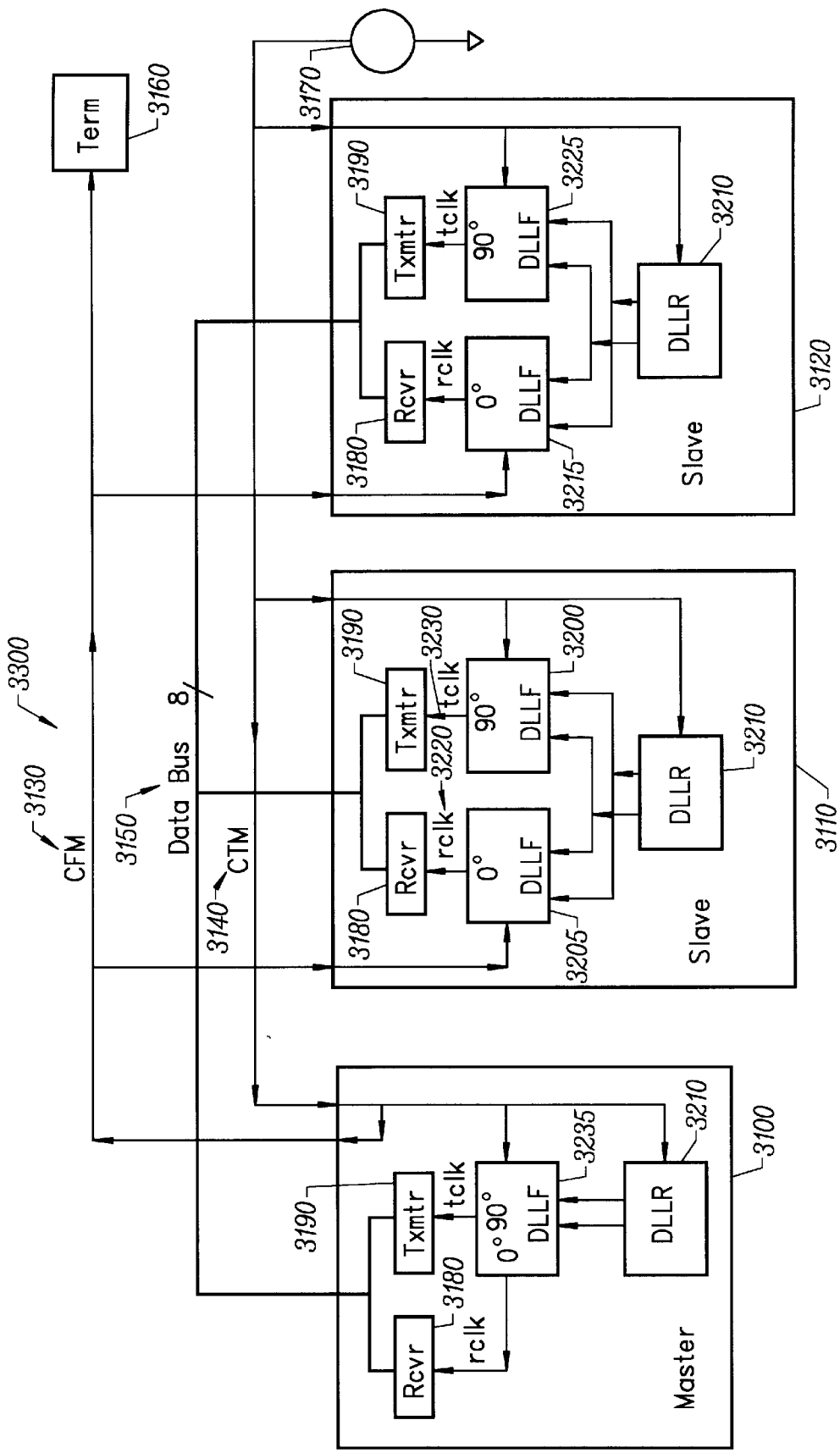
FIG. 22 is a block diagram of a DRAM system incorporating the present invention.

FIG. 22 shows a system application for the delay-locked loops of the present invention. In the case shown, master device 3100 communicates with slave device 3110 or slave device 3120. Slave devices 3110 or 3120 may communicate with master device 3100 but not with each other. The system operates from a pair of clocks generated from oscillator 3170 which generates CTM (Clock To Master) 3140 and CFM (Clock From Master) 3130. CTM travels in the direction from the slave device to the master device and is used for transmitting data to the master on data bus 3150. In the master, CTM is looped back to generate CFM which travels in the direction from master to slave device and is used for transmitting data from the master to the slave device. Each device, master or slave, has a data receiver Rcvr 3180 and a data transmitter Txmtr 3190 for receiving and sending data respectively. The Rcvr 3180 uses a signal rclk 3220 to receive the data from the data Bus and Txmtr 3190 uses tclk 3230 to transmit the data onto the data bus. Signals rclk and tclk are generated from a pair of delay-locked loops 3200 and 3205 in the slave and from a single delay-locked loop 3235 in the master, because the master makes no distinction between CTM and CFM.

In FIG. 22 DLLR 3210 is the delay-locked loop for generating the phase vectors and is called the reference loop. Each device uses a single DLLR loop. DLLF 3200 is the delay-locked loop for generating a predetermined phase relationship between the input clock and the output clock. The DLLF 3200 loop is used to generate a 90 degree phase relationship between CTM and tclk, because data is always transmitted in quadrature to the receive clock. The DLLF 3205 is used to generate a zero degree phase relationship between CFM and rclk. Thus, when a slave sends data to the master, the data changes occur 90 degrees out of phase with the CTM clock, the clock traveling toward the master. The master receives the clock CTM and generates the rclk signal for operating its receiver. Signal rclk in the master is in a 0 degree phase relationship with CTM so that the data is sampled when it is not changing. Similarly, when the master sends data to a slave, it clocks its transmitter changing the data on the data bus with tclk which is in a 90 degree phase relationship with the CFM. A slave 3110 receiving the data in its receiver 3180 operates its receiver using rclk which has a 0 degree phase relationship with the CFM. Thus, the receiver will sample the data when it is not changing. In this manner, data may be transmitted using both edges of the CTM or CFM clocks and safely sampled in the receiver.

In one embodiment, the master of FIG. 22 is an intelligent device, such as a microprocessor, an application specific integrated circuit (ASIC), a memory controller, or a graphics engine. The slave devices may be DRAMs, SRAMs, ROMs, EPROMs, flash memories, or other memory devices.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for generating an output clock with a predetermined phase relationship with an input clock, the method comprising the steps of:

selecting a pair of adjacent phase vectors from a set of phase vectors, each vector separated in time from an adjacent vector by a unit delay;

generating the output clock using an interpolator that receives the selected pair of phase vectors;

delaying the output clock from the interpolator by a delay equal to a multiple of the unit delay to produce a feedback clock;

adjusting the selection of a pair of adjacent phase vectors received by the interpolator so that the phase of the input clock lies between the selected pair of phase vectors;

detecting the difference in phase between the input clock and the feedback clock;

interpolating between the selected pair of adjacent phase vectors using the interpolator so that the feedback clock is in phase with the input clock based on the detected phase difference between the input clock and the feedback clock; and wherein the output clock from the interpolator has the predetermined phase relationship with the input clock when the feedback clock is in phase with the input clock, the predetermined phase relationship being a multiple of the unit delay.

2. The method of claim 1, wherein the step of detecting the difference in phase includes the step of filtering the detected phase difference between the input clock and the feedback clock.

3. The method of claim 1, further comprising the step of storing the current selection of phase vectors and the current adjustment of the interpolator, wherein the current selection of phase vectors and the current adjustment of the interpolator are preserved during a period of time when the input clock not is not present or the set of phase vectors is not present.

4. The method of claim 1, wherein the multiple of the unit delay includes zero.

5. The method of claim 1, further comprising the step of delaying the output clock from the interpolator by a delay equal to a multiple of the unit delay to produce the output clock, wherein the output clock has a predetermined phase relationship with the input clock, the predetermined phase relationship being a multiple of the unit delay.

6. The method of claim 5, wherein the output clock may lead or lag the input clock by a multiple of the unit delay.

7. The method of claim 1, wherein the output clock from the interpolator is buffered with a first clock buffer to produce the output clock; and wherein the feedback clock is buffered with a second clock buffer to produce the feedback clock, the first and second clock buffers having substantially the same delay and the output clock having a predetermined phase relationship with the input clock, the predetermined phase relationship being a multiple of the unit delay.

8. Circuitry for generating an output clock having a predetermined phase relationship with an input clock, the circuitry comprising:

selection circuitry having as inputs a set of phase vectors and a selection control signal, each vector separated in time from an adjacent vector by a unit delay, the selection circuitry for selecting a pair of adjacent phase vectors from the set;

a phase interpolator circuit receiving the selected pair of adjacent phase vectors and a phase adjust signal and generating the output clock, the phase interpolator for adjusting the phase of the output clock;

at least one feedback delay element coupled to the output clock to produce a feedback clock, the feedback delay element delaying the feedback clock from the output clock by an amount equal to a multiple of the unit delay; and a phase adjusting circuit receiving the input clock and the feedback clock, wherein the phase adjusting circuit produces the selection control signal for adjusting the selection of a pair of adjacent phase vectors produced by the selection circuitry so that the phase of the input clock lies between the selected pair of adjacent phase vectors and wherein the phase adjusting circuit produces the phase adjust signal for adjusting the phase interpolator so that the feedback clock is in phase with the input clock, wherein the output clock has the predetermined phase relationship with the input clock when the feedback clock is in phase with the input clock, the predetermined phase relationship being a multiple of the unit delay.

9. The circuitry of claim 8, wherein the multiple of the unit delay includes zero.

10. The circuitry of claim 8, wherein the output clock from the phase interpolator is buffered with a first clock buffer to produce the output clock and wherein the feedback clock is buffered with a second clock buffer to produce the feedback clock, the first and second clock buffers having substantially the same delay and the output clock having a predetermined phase relationship with the input clock, the predetermined phase relationship being a multiple of the unit delay.

11. The circuitry of claim 8, wherein the phase adjusting circuit comprises:

a phase detector receiving the input clock and the feedback clock, the phase detector for determining whether the feedback clock is in phase with the input clock and for producing a phase detector output based on the difference in phase between the feedback clock and the input clock; and a control circuit receiving the phase detector output signal, the control circuit producing the selection control signal for adjusting the selection of a pair of phase vectors generated by the selection circuitry and producing the phase adjust signal for adjusting the phase interpolator.

12. The circuitry of claim 11, wherein the control circuit includes a digital storage circuit having state information for representing the currents election of phase vectors and the adjustment of the phase interpolator.

13. The circuitry of claim 12, wherein the state information of the digital storage circuit is preserved when the input clock not is not present or the set of phase vectors is not present.

14. The circuitry of claim 11, wherein the control circuit includes:

a counter circuit receiving the phase detector output signal and generating a digital count based on the phase detector output signal; and a digital-to-analog converter receiving the digital count and generating the phase adjust signal, wherein the phase adjust signal is an analog signal proportional to the digital count.

15. The circuitry of claim 11, wherein the control circuit includes:

a filter receiving the phase detector output signal and generating a filtered phase detector output signal for reducing loop jitter;

a counter circuit receiving the filtered phase detector output signal and generating a digital count based on the phase detector output signal; and a digital-to-analog converter receiving the digital count and generating the phase adjust signal, wherein the phase adjust signal is an analog signal proportional to the digital count.

16. The circuitry of claim 15, wherein the filter is a digital filter.

17. The circuitry of claim 8, further comprising:

a first duty cycle correcting amplifier receiving the feedback clock;

a second duty cycle correcting amplifier receiving the output clock; and a duty cycle correcting circuit receiving the feedback clock and adjusting the first and second duty cycle correcting amplifiers such that the feedback clock and output clock have substantially the same duty cycle, wherein the duty cycle is substantially close to 50%.

18. Circuitry for generating an output clock signal having a predetermined phase relationship with an input clock signal, the circuitry comprising:

selection circuitry having as inputs a set of phase vector signals and a selection control signal, each phase vector signal separated in time from an adjacent phase vector signal by a unit delay, the selection circuitry for selecting a pair of adjacent phase vector signals from the set;

a phase interpolator circuit receiving the selected pair of adjacent phase vector signals and a phase adjust signal and generating a phase interpolator output clock signal, the phase interpolator circuit adjusting the phase of the phase interpolator output clock;

at least one output delay element to receive the phase interpolator output clock signal and to produce the output clock signal, the output delay element delaying the phase interpolator output clock signal by an amount equal to a multiple of the unit delay; and a phase adjusting circuit receiving the input clock signal and the phase interpolator output clock signal, wherein the phase adjusting circuit produces the selection control signal for adjusting the selection of a pair of adjacent phase vector signals produced by the selection circuitry so that the phase of the input clock signal lies between the selected pair of adjacent phase vector signals and wherein the phase adjusting circuit produces the phase adjust signal for adjusting the phase interpolator so that the phase interpolator output clock signal is in phase with the input clock signal, wherein the output clock signal has the predetermined phase relationship with the input clock signal when the phase interpolator output clock signal is in phase with the input clock signal, the predetermined phase relationship being a multiple of the unit delay.

19. The circuitry of claim 18 further comprising:

at least one feedback delay element coupled to the phase adjusting circuit for delaying the phase interpolator output clock signal by an amount equal to a multiple of the unit delay.

20. The circuitry of claim 19, wherein the output clock signal may lead or lag the input clock signal by a multiple of the unit delay.

* * * * *

UNITED STATES PATENT AND TRADEMARK OFFICE
CERTIFICATE OF CORRECTION

PATENT NO. : 6,125,157
DATED : September 26, 2000
INVENTOR(S) : Kevin S. Donnely et al.

It is certified that error appears in the above-identified patent and that said Letters Patent is hereby corrected as shown below:

<u>Title page,</u>
Item [75], Inventors, after "Donald C. Stark, Palo Alto" please insert -- ; Nhat M. Nguyen, San Jose --.

Signed and Sealed this

Seventh Day of May, 2002

Attest:

JAMES E. ROGAN
*Attesting Officer*  *Director of the United States Patent and Trademark Office*